(12) United States Patent
Yamashita et al.

(10) Patent No.: US 8,013,454 B2
(45) Date of Patent: *Sep. 6, 2011

(54) WIRING SUBSTRATE AND DISPLAY DEVICE INCLUDING THE SAME

(75) Inventors: Kenichi Yamashita, Tenri (JP); Tetsuya Aita, Sakai (JP)

(73) Assignee: Sharp Kabushiki Kaisha, Osaka (JP)

( * ) Notice: Subject to any disclaimer, the term of this patent is extended or adjusted under 35 U.S.C. 154(b) by 188 days.

This patent is subject to a terminal disclaimer.

(21) Appl. No.: 12/089,060

(22) PCT Filed: Jun. 13, 2006

(86) PCT No.: PCT/JP2006/311800
§ 371 (c)(1),
(2), (4) Date: Apr. 3, 2008

(87) PCT Pub. No.: WO2007/039959
PCT Pub. Date: Apr. 12, 2007

(65) Prior Publication Data
US 2009/0153765 A1 Jun. 18, 2009

(30) Foreign Application Priority Data
Oct. 5, 2005 (JP) .................. 2005-292151

(51) Int. Cl.
*H01L 23/48* (2006.01)
*H01L 23/52* (2006.01)
*H01L 29/40* (2006.01)
*G02F 1/1345* (2006.01)
*H05K 1/11* (2006.01)
*H05K 1/14* (2006.01)
*H01L 21/00* (2006.01)

(52) U.S. Cl. ........ 257/778; 257/782; 257/783; 349/149; 349/151; 349/152; 361/803; 438/118; 438/119; 438/125

(58) Field of Classification Search .................. 349/152
See application file for complete search history.

(56) References Cited

U.S. PATENT DOCUMENTS

| | | | |
|---|---|---|---|
| 5,650,919 A | 7/1997 | Loh et al. | |
| 5,798,812 A * | 8/1998 | Nishiki et al. | 349/152 |
| 5,825,081 A * | 10/1998 | Hosomi et al. | 257/668 |
| 6,767,763 B1 * | 7/2004 | Uchiyama | 438/116 |
| 7,446,844 B2 * | 11/2008 | Hong | 349/152 |

(Continued)

FOREIGN PATENT DOCUMENTS
JP 05-072551 A 3/1993
(Continued)

OTHER PUBLICATIONS

Official communication issued in the International Application No. PCT/JP2006/311800, mailed on Sep. 12, 2006.

(Continued)

*Primary Examiner* — N Drew Richards
*Assistant Examiner* — Michael Jung
(74) *Attorney, Agent, or Firm* — Keating & Bennett, LLP

(57) ABSTRACT

An active matrix substrate includes a first substrate, a driving integrated circuit chip mounted on the first substrate with an anisotropic electrically conductive layer, and an insulating member. The insulating member isolates a terminal from a wiring and a bump electrode that are adjacent to the terminal portion and isolates a bump electrode facing the terminal portion from a bump electrode and a wiring that are adjacent to the bump electrode.

23 Claims, 20 Drawing Sheets

U.S. PATENT DOCUMENTS

| | | | |
|---|---|---|---|
| 2004/0165138 A1* | 8/2004 | Hwang et al. | 349/152 |
| 2005/0211464 A1* | 9/2005 | Byun et al. | 174/259 |
| 2005/0286240 A1* | 12/2005 | Sakamoto et al. | 361/803 |
| 2006/0223239 A1* | 10/2006 | Khaw et al. | 438/127 |
| 2007/0045647 A1* | 3/2007 | Lin et al. | 257/99 |

FOREIGN PATENT DOCUMENTS

| | | |
|---|---|---|
| JP | 09-244047 A | 9/1997 |
| JP | 11-340282 A | 12/1999 |
| JP | 2004-111808 A | 4/2004 |
| JP | 2004-128259 A | 4/2004 |
| JP | 2004-134653 A | 4/2004 |
| JP | 2004-259887 A | 9/2004 |

OTHER PUBLICATIONS

Yamashita; "Wiring Substrate and Display Device Including the Same"; U.S. Appl. No. 12/089,059, filed Apr. 3, 2008.

* cited by examiner

WIRING SUBSTRATE AND DISPLAY DEVICE INCLUDING THE SAME

BACKGROUND OF THE INVENTION

1. Field of the Invention

The present invention relates to a wiring substrate and a display device including the same.

2. Description of the Related Art

In recent years, a flip chip mounting method using an anisotropic electrically conductive film (hereinafter, sometimes referred to as "ACF") or an anisotropic electrically conductive paste (hereinafter, sometimes referred to as "ACP") or the like has been widely used as a method for mounting an integrated circuit chip (hereinafter, sometimes referred to as an "IC chip") to a wiring substrate. See, for example, Japanese Laid-Open Patent Publication No. 9-244047.

However, in the case where an IC chip is flip chip mounted with an ACF or ACP, adjacent terminals and bump electrodes are short-circuited by electrically conductive fine particles included in the ACF and the like, causing a leakage current. Adjacent terminals and bump electrodes are likely to be short-circuited especially in the case where a fine-pitch IC chip having closely spaced bump electrodes is mounted. Adjacent terminals and bump electrodes are also likely to be short-circuited in the case where the concentration of electrically conductive fine particles is increased to assure electric connection between terminals and bump electrodes.

Japanese Laid-Open Patent Publication No. 9-244047 discloses a liquid crystal display device having a passivation film (wall) between wirings on a substrate (see FIG. 1 of Japanese Laid-Open Patent Publication No. 9-244047). This passivation film is not provided in order to suppress generation of leakage current, but to prevent electrically conductive particles from going out from the space between a bump electrode and a terminal in a heat pressure bonding process of an anisotropic electrically conductive film. In the liquid crystal display device of Japanese Laid-Open Patent Publication No. 9-244047, wirings on the substrate are isolated from each other by the passivation film. Therefore, outflow of electrically conductive particles can be suppressed and short-circuiting between wirings can also be suppressed to some extent. However, the space between adjacent bump electrodes is filled with an anisotropic electrically conductive film and adjacent bump electrodes are not isolated from each other by the passivation film. Therefore, in the liquid crystal display device of Japanese Laid-Open Patent Publication No. 9-244047, adjacent bump electrodes may be short-circuited by electrically conductive fine particles and generation of leakage current is not sufficiently suppressed.

SUMMARY OF THE INVENTION

In order to overcome the problems described above, preferred embodiments of the present invention provide a wiring substrate with suppressed generation of leakage current.

A wiring substrate according to a preferred embodiment of the present invention includes a substrate, an integrated circuit chip, an anisotropic electrically conductive layer, and an insulating member. The substrate has a plurality of wirings extending in parallel or substantially in parallel with each other. Each of the plurality of wirings has a terminal portion. The integrated circuit chip has a plurality of bump electrodes. The bump electrodes are provided corresponding to the respective terminal portions (at corresponding locations) so as to face the respective terminal portions. The anisotropic electrically conductive layer is provided between the substrate and the integrated circuit chip. The anisotropic electrically conductive layer is made of an insulating resin having electrically conductive fine particles dispersed therein. The electrically conductive fine particles electrically connect the terminal portions to the plurality of bump electrodes. The insulating member isolates a terminal portion from a wiring and a bump electrode that are adjacent to the terminal portion and isolates a bump electrode facing the terminal portion from a bump electrode and a wiring that are adjacent to the bump electrode.

In the wiring substrate according to a preferred embodiment of the present invention, a terminal portion and a wiring and a bump electrode that are adjacent to the terminal portion are effectively prevented from being short-circuited by the electrically conductive fine particles. Moreover, a bump electrode, and a bump electrode and a wiring that are adjacent to the bump electrode are effectively prevented from being short-circuited by the electrically conductive fine particles. Accordingly, generation of leakage current can be effectively suppressed by the present preferred embodiment of the present invention.

In preferred embodiments of the present invention, "isolating a terminal portion from a wiring and a bump electrode that are adjacent to the terminal portion" means to isolate a terminal portion from a wiring and a bump electrode that are adjacent to the terminal portion to such a degree that the terminal portion and the adjacent wiring and bump electrode are not short-circuited by the electrically conductive fine particles, and is not limited to spatially completely isolating a terminal portion from a wiring and a bump electrode that are adjacent to the terminal portion. Similarly, "isolating a bump electrode from a bump electrode and a wiring that are adjacent to the bump electrode" means to isolate a bump electrode from a bump electrode and a wiring that are adjacent to the bump electrode to such a degree that the bump electrode and the adjacent bump electrode and wiring are not short-circuited by the electrically conductive fine particles, and is not limited to spatially completely isolating a bump electrode from a bump electrode and a wiring that are adjacent to the bump electrode.

In the wiring substrate according to a preferred embodiment of the present invention, the insulating member may be provided between a terminal portion and a wiring adjacent to the terminal portion on the substrate, and a gap between a top of the insulating member and the integrated circuit chip may be equal to or less than a particle size of the electrically conductive fine particles.

In the case where the gap between the top of the insulating member and the integrated circuit chip is equal to or less than the particle size of the electrically conductive fine particles, the electrically conductive fine particles can be effectively prevented from being disposed between the insulating member and the integrated circuit chip. Therefore, short-circuiting can be effectively suppressed between a terminal portion and a wiring adjacent to the terminal portion which are isolated from each other by the insulating member and between a terminal portion and a bump electrode facing the terminal portion which are isolated from each other by the insulating member. In order to effectively prevent the electrically conductive fine particles from being disposed between the insulating member and the integrated circuit chip, it is preferable that the insulating member has an approximately trapezoidal shape in cross section with a width reduced from the substrate toward the integrated circuit chip. In other words, it is preferable that a top surface of the insulating member has a narrower width. It is more preferable that a width of the top surface of the insulating member is equal to or less than the particle size of the electrically conductive fine particles.

Note that the particle size of the electrically conductive fine particles specifically refers to a mean particle size of the electrically conductive fine particles. The particle size of the electrically conductive fine particles can be measured with a laser diffraction/scattering particle size distribution analyzer (LA-300) made by HORIBA, Ltd.

In the wiring substrate according to a preferred embodiment of the present invention, the insulating member may be provided between adjacent bump electrodes on the integrated circuit chip and a gap between a top of the insulating member and the substrate may be equal to or less than the particle size of the electrically conductive fine particles.

As in the case described above, when the gap between the top of the insulating member and the substrate is equal to or less than the particle size of the electrically conductive fine particles, the electrically conductive fine particles can be prevented from being disposed between the insulating member and the substrate. Accordingly, short-circuiting can be effectively suppressed between adjacent bump electrodes isolated from each other by the insulating member and between a bump electrode and a terminal portion that faces a bump electrode adjacent to the bump electrode. In order to effectively prevent the electrically conductive fine particles from being disposed between the insulating member and the integrated circuit chip, it is preferable that the insulating member has an approximately trapezoidal shape in cross section with a width reduced from the integrated circuit chip toward the substrate. In other words, it is preferable that a top surface of the insulating member has a narrower width. It is more preferable that a width of the top surface of the insulating member is equal to or less than the particle size of the electrically conductive fine particles.

In the wiring substrate according to a preferred embodiment of the present invention, it is preferable that the insulating member is in contact with both the substrate and the integrated circuit chip.

With this structure, the insulating member can more effectively provide isolation between adjacent terminal portions, between adjacent bump electrodes, and between a terminal portion and a bump electrode that faces a terminal portion adjacent to the terminal portion. Therefore, generation of leakage current can be more effectively suppressed.

In the wiring substrate according to a preferred embodiment of the present invention, the substrate may be made of plastic.

In the wiring substrate according to a preferred embodiment of the present invention, each terminal portion may be wider than a portion other than the terminal portion of the wiring and the terminal portions may be linearly arranged in a width direction of the terminal portions, and the insulating member may be provided only between adjacent terminal portions.

In the case where each terminal portion is wider than the portion other than the terminal portion of the wiring and the terminal portions are linearly arranged in the width direction of the terminal portions, the space between adjacent terminal portions having a relatively wide width is narrower than the space between the terminal portion of the wiring and the portion other than the terminal portion of an adjacent wiring and the space between the portions other than the terminal portions of adjacent terminals. Therefore, a leakage current is likely to be generated especially between adjacent terminal portions. In this structure, however, the insulating member is provided between adjacent terminal portions. Therefore, short-circuiting between adjacent terminal portions can be effectively suppressed, whereby generation of leakage current can be effectively suppressed.

In the wiring substrate according to a preferred embodiment of the present invention, each terminal portion may be wider than a portion other than the terminal portion of the wiring and the terminal portions may be arranged in a staggered pattern along a width direction of the terminal portions, and the insulating member may be provided only between a terminal portion and a wiring adjacent to the terminal portion.

In the case where each terminal portion is wider than the portion other than the terminal portion of the wiring and the terminal portions are arranged in a staggered pattern along the width direction of the terminal portions, the space between each terminal portion and a wiring adjacent to the terminal portion is relatively narrow and a leakage current is likely to be generated especially in that region. In this structure, however, the insulating member is provided in this relatively narrow space between each terminal portion and a wiring adjacent to the terminal portion. Therefore, generation of leakage current can be effectively suppressed.

In the wiring substrate according to a preferred embodiment of the present invention, the anisotropic electrically conductive layer may be formed by a wet process. The anisotropic electrically conductive layer can be easily formed at low cost by using a wet process.

Note that a "wet process" is a layer formation method that uses ink containing a material for forming a layer (the material is herein an insulating resin and electrically conductive fine particles). Examples of the wet process include a spin coating method, a doctor blade method, a discharge coating method, a spray coating method, an ink jet method, a letterpress printing method, an intaglio printing method, a screen printing method, a microgravure coating method, and the like.

In the case where the anisotropic electrically conductive layer is formed by a wet process, it is preferable that at least a side surface and a top surface of the insulating member have a liquid repellent property. In other words, it is preferable that the side surface and the top surface of the insulating member have a property to repel ink that is used in the wet process. Examples of a method for applying a liquid repellent property (a property to repel ink for forming a layer) to the side surface and the top surface of the insulating member include a method in which the insulating member is made of a material having a liquid repellent property and a method in which liquid repellent treatment such as plasma treatment is conducted to the insulating member.

The wiring substrate according to a preferred embodiment of the present invention may further include a support member provided between the integrated circuit chip and the substrate so as to be in contact with both the integrated circuit chip and the substrate.

An integrated circuit chip is generally mounted on a substrate by the following procedures: first, a substrate having an ACF or ACP is placed on a pressure bonding stage. An integrated circuit chip is then placed at a prescribed position on the substrate. The integrated circuit chip is heated and pressed with a heated pressure bonding tool.

In order to mount an integrated circuit chip in a preferable manner, it is preferable that the pressure bonding tool and the pressure bonding stage are completely parallel to each other in the heating/pressurizing step. With current technology, however, it is difficult to hold the pressure bonding tool and the pressure bonding stage completely parallel to each other, and the pressure bonding tool and the pressure bonding stage are usually somewhat tilted with respect to each other.

In the case where the pressure bonding tool and the pressure bonding stage are tilted with respect to each other, the pressure is not uniformly applied between each terminal portion and bump electrode. In other words, the applied pressure is excessive in some regions and is not enough to bond the terminal portions to the bump electrodes in other regions. Such an excessive pressure may damage or disconnect the terminal portions and the bump electrodes and an insufficient pressure may cause unreliable electrical conduction between the terminal portion and the bump electrode.

However, since the wiring substrate according to a preferred embodiment of the present invention further includes the support member that is in contact with both the integrated circuit chip and the substrate, non-uniformity of pressure application due to the tilt between the pressure bonding tool and the pressure bonding stage can be minimized. As a result, the region to which an excessive pressure is applied and the region to which an insufficient pressure is applied can be reduced. Accordingly, the integrated circuit chip can be mounted with high reliability in electrical connection.

In order to implement higher reliability in electrical connection, the support member is preferably arranged so as to uniformly support the integrated circuit chip. More specifically, the support member may be provided between at least a portion of a periphery of the integrated circuit chip and the substrate. The support member may be shaped like a wall and extends as a band so as to surround the integrated circuit chip. The support member may be provided between each of four corners of the integrated circuit and the substrate.

Note that the support member preferably has an insulating property. The anisotropic electrically conductive layer containing electrically conductive fine particles is provided between the integrated circuit chip and the substrate. Therefore, a bump electrode, a terminal portion, and the like may be electrically connected to each other through the support member and the electrically conductive fine particles. However, in the case where the support member has an insulating property, a terminal portion, a bump electrode, and the like are not short-circuited through the support member and generation of leakage current can be effectively suppressed.

A first display device according to a preferred embodiment of the present invention includes a wiring substrate, a first electrode, a display medium layer, and a second electrode. The wiring substrate includes a substrate, an integrated circuit chip, an anisotropic electrically conductive layer, and an insulating member. The substrate has a plurality of wirings extending in parallel or substantially parallel with each other. Each of the plurality of wirings has a terminal portion. The integrated circuit chip has a plurality of bump electrodes. The plurality of bump electrodes are provided corresponding to the respective terminal portions so as to face the respective terminal portions. The anisotropic electrically conductive layer is provided between the substrate and the integrated circuit chip. The anisotropic electrically conductive layer is made of an insulating resin having electrically conductive fine particles dispersed therein for electrically connecting the terminal portions to the plurality of bump electrodes. The insulating member isolates a terminal portion from a wiring and a bump electrode that are adjacent to the terminal portion and isolates a bump electrode facing the terminal portion from a bump electrode and a wiring that are adjacent to the bump electrode. The display medium layer is provided on the first electrode. The second electrode is provided on the display medium layer.

In the first display device according to a preferred embodiment of the present invention, a terminal portion and a wiring and a bump electrode that are adjacent to the terminal portion can be effectively prevented from being short-circuited by the electrically conductive fine particles. Moreover, a bump electrode and a bump electrode and a wiring that are adjacent to the bump electrode can be effectively prevented from being short-circuited by the electrically conductive fine particles. Accordingly, generation of leakage current can be effectively suppressed and minimized by preferred embodiments of the present invention. As a result, a display device having high electrical reliability can be implemented.

In this specification, a "display medium layer" is a layer in which light transmittance or light reflectance is modulated by a potential difference between opposing electrodes or a layer that emits light by a current flowing between opposing electrodes. Examples of the display medium layer include a liquid crystal layer, an inorganic or organic electroluminescence layer, a light-emitting gas layer, an electrophoretic layer, an electrochromic layer, and the like.

A second display device according to another preferred embodiment of the present invention includes a first wiring substrate, a second wiring substrate having the first wiring substrate mounted thereon, a display medium layer, and a second electrode. The first wiring substrate includes a substrate, an integrated circuit chip, an anisotropic electrically conductive layer, and an insulating member. The substrate has a plurality of first wirings extending in parallel with each other. Each of the plurality of first wirings has a terminal portion. The integrated circuit chip has a plurality of bump electrodes. The plurality of bump electrodes are provided corresponding to the respective terminal portions so as to face the respective terminal portions. The anisotropic electrically conductive layer is provided between the substrate and the integrated circuit chip. The anisotropic electrically conductive layer is made of an insulating resin having electrically conductive fine particles dispersed therein for electrically connecting the terminal portions to the plurality of bump electrodes. The insulating member isolates a terminal portion from a first wiring and a bump electrode that are adjacent to the terminal portion and isolates a bump electrode facing the terminal portion from a bump electrode and a first wiring that are adjacent to the bump electrode.

The second wiring substrate includes a plurality of second wirings and a first electrode. The plurality of second wirings are respectively electrically connected to the plurality of first wirings. The first electrode is electrically connected to the plurality of second wirings. The display medium layer is provided on the first electrode. The second electrode is provided on the display medium layer.

In the second display device according to a preferred embodiment of the present invention, a terminal portion and a wiring and a bump electrode that are adjacent to the terminal portion can be effectively prevented from being short-circuited by the electrically conductive fine particles. Moreover, a bump electrode and a bump electrode and a wiring that are adjacent to the bump electrode can be effectively prevented from being short-circuited by the electrically conductive fine particles. Accordingly, generation of leakage current can be effectively prevented by preferred embodiments of the present invention. As a result, a display device having high electrical reliability can be provided.

Other features, elements, processes, steps, characteristics and advantages of the present invention will become more apparent from the following detailed description of preferred embodiments of the present invention with reference to the attached drawings.

DETAILED DESCRIPTION OF THE PREFERRED EMBODIMENTS

Hereinafter, preferred embodiments of the present invention will be described in detail with reference to the figures.

First Preferred Embodiment

Figure 1:
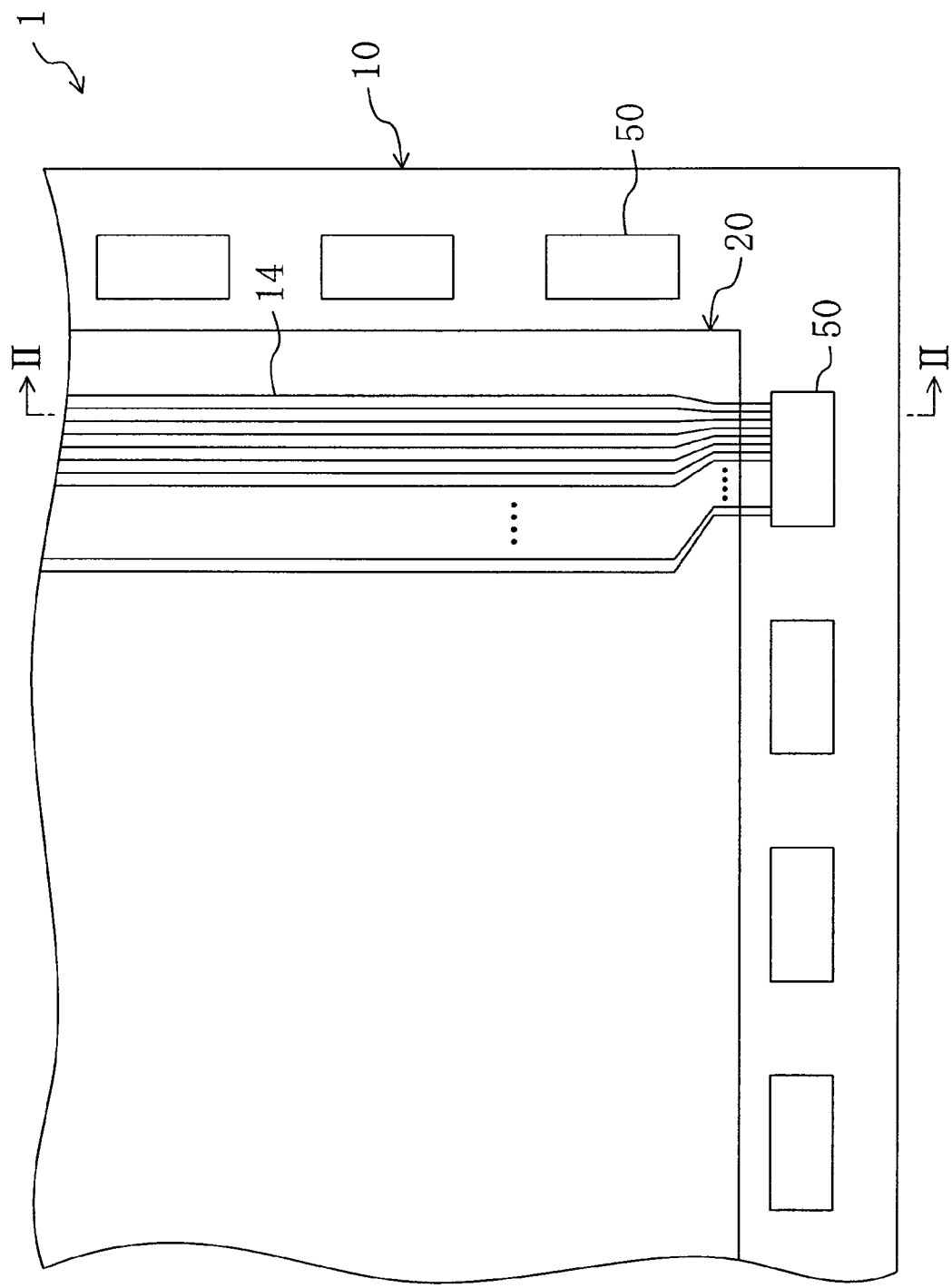
FIG. 1 is a plan view of a liquid crystal display device according to a first preferred embodiment of the present invention.

FIG. 1 is a plan view of a liquid crystal display device 1 according to a first preferred embodiment of the present invention.

Figure 2:
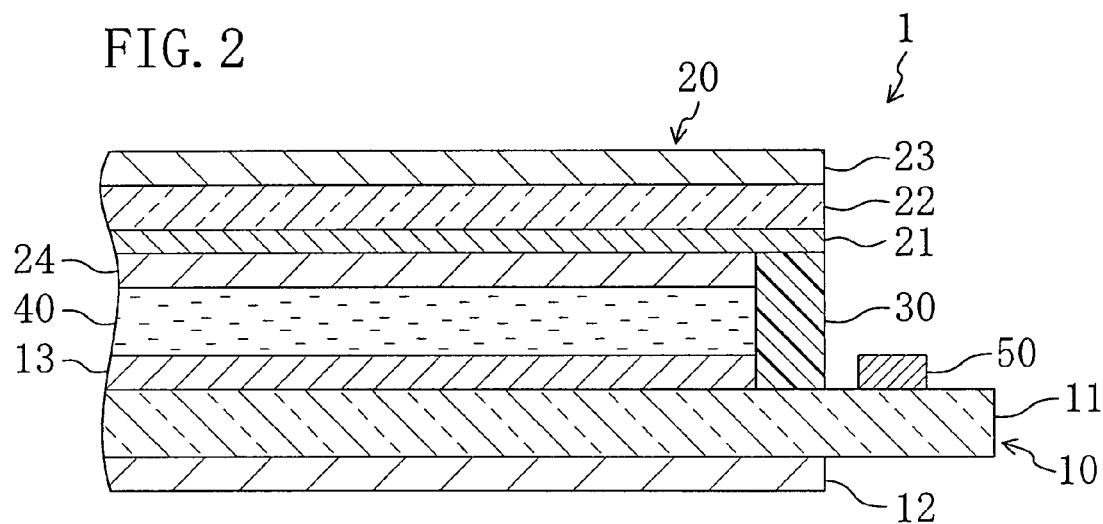
FIG. 2 is a cross-sectional view taken along line II-II in FIG. 1.

FIG. 2 is a cross-sectional view taken along line II-II in FIG. 1.

The liquid crystal display device 1 of the first preferred embodiment preferably includes an active matrix substrate 10, a counter substrate 20 facing the active matrix substrate 10, a liquid crystal layer 40 interposed between the active matrix substrate 10 and the counter substrate 20 as a display medium layer, and a seal member 30 bonding the active matrix substrate 10 and the counter substrate 20 to each other and sealing the liquid crystal layer 40.

The active matrix substrate 10 has a first substrate 11 made of plastic or glass and a first polarizing plate 12 provided on the opposite side to the liquid crystal layer 40 on the first substrate 11. A plurality of gate lines and a plurality of source lines are provided on the active matrix substrate 10. The plurality of gate lines extend in parallel or substantially in parallel with each other and the plurality of source lines extend in parallel or substantially in parallel with each other at an angle (typically at a right angle) to the extending direction of the gate lines (in this specification, electrode lines such as gate lines and source lines are collectively referred to as "wirings" 14). A switching element (not shown) such as a TFT (Thin Film Transistor) element is provided near each intersection of the gate lines and the source lines. Each switching element is electrically connected to a corresponding gate line and a corresponding source line. A plurality of pixel electrodes 13 are arranged in a prescribed pattern (typically, in a matrix pattern) on the surface of the active matrix substrate 10 located on the side of the liquid crystal layer 40. Each pixel electrode 13 is electrically connected to a corresponding switching element (not shown) and is driven by that switching element.

The counter substrate 20 has a second substrate 22, a second polarizing plate 23 provided on the opposite side to the liquid crystal layer 40 on the second substrate 22, and an upper common electrode 21 provided on the surface of the second substrate 22 on the side of the liquid crystal layer 40. The liquid crystal display device 1 is driven by voltage application to the liquid crystal layer 40 by the upper common electrode 21 and the plurality of pixel electrodes 13 provided on the active matrix substrate 10.

In the first preferred embodiment, the active matrix substrate 10 and the counter substrate 20 preferably have a substantially rectangular shape and the active matrix substrate 10 is larger than the counter substrate 20. The counter substrate 20 covers the liquid crystal layer 40 on the active matrix substrate 10. A plurality of driving integrated circuit chips (hereinafter, sometimes referred to as "driving IC chips") 50 are preferably bare-chip mounted on the periphery (exposed portion) of the active matrix substrate 10 which is not covered by the counter substrate 20.

Figure 3:
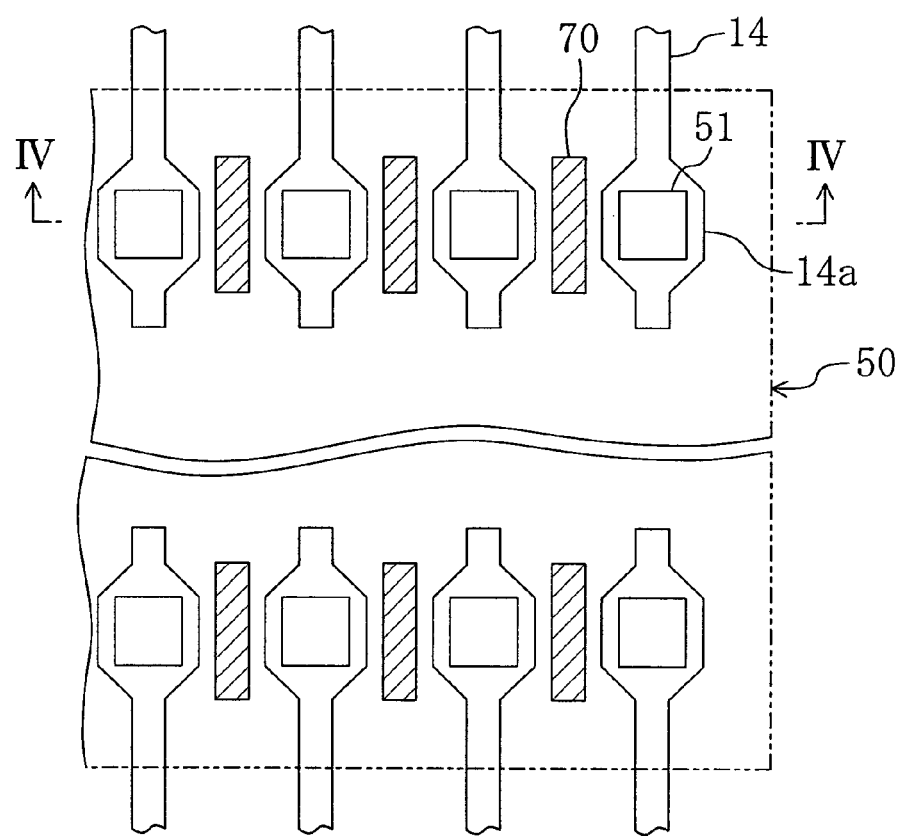
FIG. 3 is an enlarged plan view of a region around a driving IC chip.

FIG. 3 is an enlarged plan view of a region around a driving IC chip 50.

Figure 4:
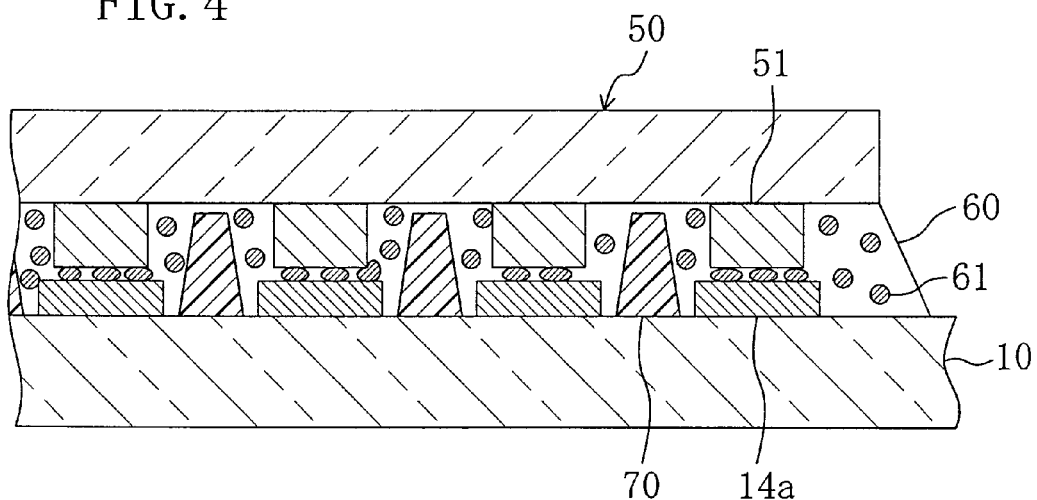
FIG. 4 is a cross-sectional view taken along line IV-IV in FIG. 3.

FIG. 4 is a cross-sectional view taken along line IV-IV in FIG. 3.

As shown in FIGS. 3 and 4, the driving IC chip 50 as an integrated circuit chip has a plurality of bump electrodes 51 as input/output terminals. The bump electrodes 51 are linearly arranged in line along the direction of the longer side of the driving IC chip 50 (the width direction of terminal portions 14a). The bump electrodes 51 function also as bonding bump electrodes. The bump electrodes 51 are respectively electrically connected through an anisotropic electrically conductive layer 60 to the terminal portions 14a of the wirings 14 provided on the periphery of the active matrix substrate 10. The anisotropic electrically conductive layer 60 is made of an insulating resin with electrically conductive fine particles 61 dispersed therein.

The liquid crystal display device 1 of the first preferred embodiment has an insulating member (an insulating wall). The insulating member 70 isolates each terminal portion 14a from a wiring 14 and a bump electrode 51 that are located adjacent to that terminal portion 14a and also isolates a bump electrode 51 facing that terminal portion 14a from a bump electrode 51 and a wiring 14 that are located adjacent to that bump electrode 51. More specifically, the insulating member 70 is provided between adjacent terminal portions 14a on the active matrix substrate 10.

For example, in the case where the insulating members 70 are not provided, the electrically conductive fine particles 61 in the anisotropic electrically conductive layer 60 may cause short-circuiting between adjacent wirings 14, between adjacent bump electrodes 51, or between a wiring 14 and a bump electrode 51, and a leakage current may be generated. Such short-circuiting between electrically conductive members such as wirings 14 and bump electrodes 51 is likely to occur especially in the case where the anisotropic electrically conductive layer 60 containing a high concentration of electrically conductive fine particles 61 is used in order to reliably electrically connect the terminal portions 14a with the bump electrodes 51, in the case where a fine-pitch driving IC chip 50 having closely spaced bump electrodes 51 is used, and the like.

However, providing the insulating member 70 between adjacent terminal portions 14a as in the first preferred embodiment can effectively suppress generation of leakage current resulting from short-circuiting between adjacent wirings 14, between adjacent bump electrodes 51, or between a wiring 14 and a bump electrode 51.

The insulating member 70 may be provided entirely along a portion of each wiring 14 that is in contact with the anisotropic electrically conductive layer 60. The terminal portion 14a is preferably wider than the portion other than the terminal portion of the wiring 14. Therefore, the space between adjacent terminal portions 14a is relatively narrow and the space between the portions other than the terminal portions 14a of adjacent wirings 14 other than the terminal portions 14a and the space between the portion other than the terminal portion of a wiring 14 and the terminal portion 14a of an adjacent wiring 14 are relatively wide. Accordingly, in order to effectively suppress generation of leakage current, it is effective to provide the insulating member 70 in a region where the terminal portions 14a are adjacent to each other, as shown in FIG. 3.

As shown in FIG. 4, the insulating member 70 preferably has an approximately trapezoidal shape in cross section. In order to effectively suppress generation of leakage current, the top surface of the insulating member 70 preferably has a narrow width. More preferably, the width of the top surface of the insulating member 70 is equal to or less than the particle size (more specifically, mean particle size) of the electrically conductive fine particles 61.

In order to effectively suppress generation of leakage current, the top surface of the insulating member 70 is preferably in contact with the driving IC chip 50. However, the top surface of the insulating member 70 need not necessarily be in contact with the driving IC chip 50. As shown in FIG. 4, there may be a gap between the insulating member 70 and the driving IC chip 50. Even when there is a gap between the insulating member 70 and the driving IC chip 50, generation of leakage current can be suppressed as compared to the case where the insulating member 70 is not provided. The gap between the insulating member 70 and the driving IC chip 50 is preferably equal to or less than the particle size (more specifically, mean particle size; e.g., about 3 μm to about 5 μm, for example) of the electrically conductive fine particles 61. With this structure, the electrically conductive fine particles 61 can be effectively prevented from being disposed between the insulating member 70 and the driving IC chip 50.

Hereinafter, a manufacturing process of the liquid crystal display device 1 of the first preferred embodiment, especially a manufacturing process of the insulating member 70 and a mounting process of the driving IC chip 50, will be described in detail.

First, various wirings 14 such as gate lines and source lines, TFTs, pixel electrodes 13, and the like are formed on the first substrate 11. The insulating member 70 is then formed. The insulating member 70 can be formed by forming an insulating resin film by a wet process such as a screen printing method and patterning the insulating film by a patterning technology such as a photolithography technology.

The height of the insulating member 70 can be determined in view of the cell gap of the liquid crystal layer 40, the height of the bump electrodes 51, the height of the terminal portions 14a, and the oblateness of the electrically conductive fine particles 61. The height of the insulating member 70 is shown by, e.g., the following formula 1, where H is the height of the insulating member 70, h1 is the cell gap of the liquid crystal layer 40, h2 is the height of the bump electrodes 51, h3 is the height of the terminal portions 14a, r is the particle size of the electrically conductive fine particles 61, and A is the oblateness of the electrically conductive fine particles 61:

$$h1-r=h2+h3+r\times(1-A)-r \leq H \leq h2+h3+r\times(1-A)=h19 \qquad (1).$$

For example, the height of the insulating member 70 may be in the range of about 3 μm to about 25 μm (e.g., about 10 μm), for example.

For example, the insulating member 70 is preferably made of an acrylic resin, a novolac resin, a polyimide resin, an epoxy resin, or the like.

The periphery of the active matrix substrate 10 is then bonded to the periphery of the counter substrate 20 by the seal member 30 to form a space (an empty cell) for injection of a liquid crystal material. Thereafter, a liquid crystal material is injected (e.g., vacuum-injected) into the space (the empty cell) to form the liquid crystal layer 40.

The driving IC chips 50 are then mounted. More specifically, by a wet process such as an ink-jet method, the anisotropic electrically conductive layer 60 is formed on the periphery of the active matrix substrate 10 where the driving IC chips 50 are to be mounted. The driving IC chips 50 are then placed thereon and aligned. In this state, the active matrix substrate 10 is placed on a flat pressure bonding stage and the driving IC chips 50 are heated and pressed with a heated pressure bonding tool. The liquid crystal display device 1 is completed by thus mounting the driving IC chips 50.

In the case where the anisotropic electrically conductive layer 60 is formed by a wet process, it is preferable to apply a liquid repellent property (a property to repel ink for forming the anisotropic electrically conductive layer 60) to the surface of the insulating member 70. This can effectively suppress short-circuiting between the wirings 14, between the bump electrodes 51, or between a wiring 14 and a bump electrode 51, and therefore can effectively suppress generation of leakage current.

Note that examples of a method for applying a liquid repellent property to the surface of the insulating member 70 include a method in which the insulating member 70 is made of a fluorine-containing material having a liquid repellent property and a method in which liquid repellent treatment such as plasma treatment is conducted to the surface of the insulating member 70 after the insulating member 70 is formed.

Second Preferred Embodiment

Figure 5:
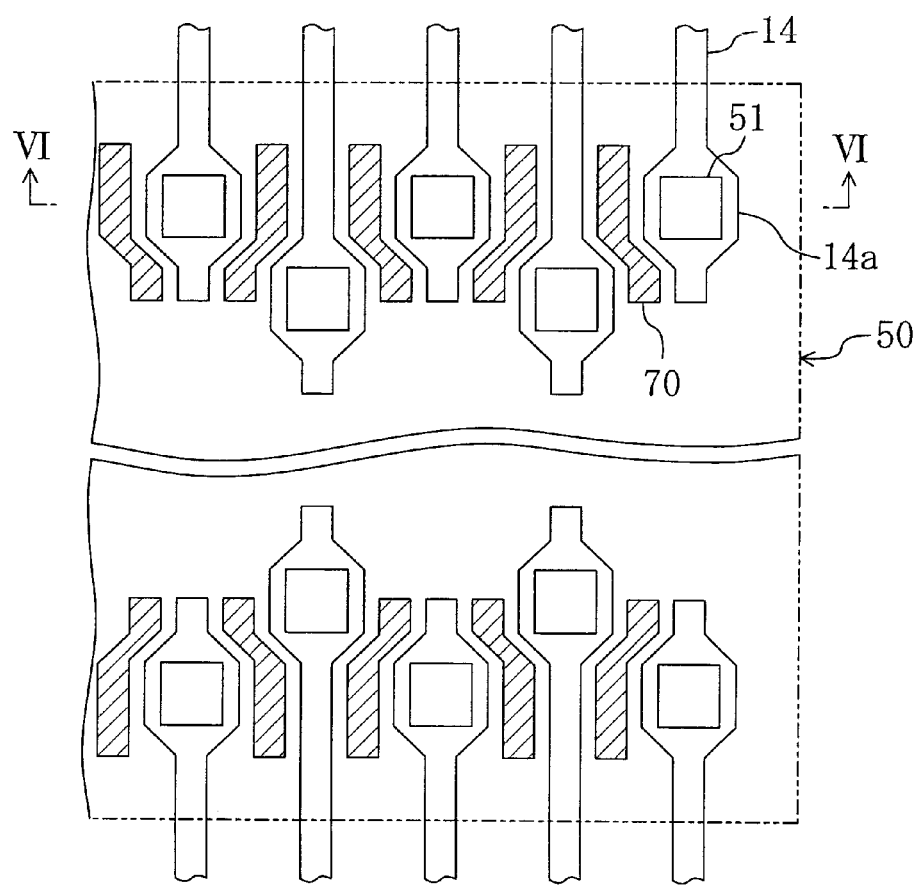
FIG. 5 is an enlarged plan view of a region around a driving IC chip of a liquid crystal display device according to a second preferred embodiment of the present invention.

FIG. 5 is an enlarged plan view of a region around a driving IC chip 50 of a liquid crystal display device according to a second preferred embodiment.

Figure 6:
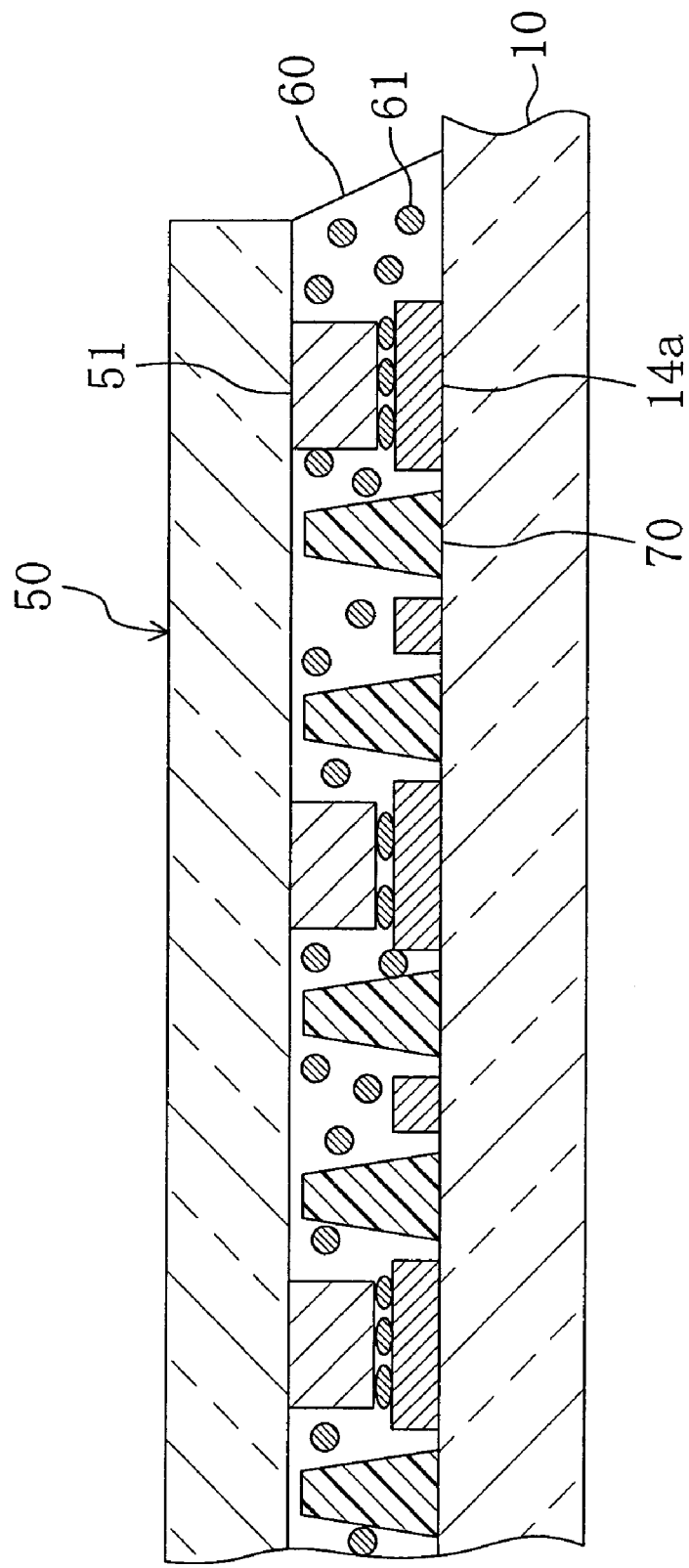
FIG. 6 is a cross-sectional view taken along line VI-VI in FIG. 5.

FIG. 6 is a cross-sectional view taken along line XI-XI in FIG. 5.

The liquid crystal display device of the second preferred embodiment preferably has the same structure as that of the liquid crystal display device 1 of the first preferred embodiment except for the arrangement of the insulating members 70, the terminal portions 14a, and the bump electrodes 51. The arrangement of the insulating members 70, the terminal portions 14a, and the bump electrodes 51 of the second preferred embodiment will now be described in detail with reference to FIGS. 5 and 6. Note that FIGS. 1 and 2 referred to in the first preferred embodiment are also referred to in the second preferred embodiment. Elements having substantially the same function as in the first preferred embodiment will be denoted by the same reference numerals and characters and description thereof will be omitted.

As shown in FIG. 5, in the second preferred embodiment, the terminal portions 14a and the bump electrodes 51 are arranged in a staggered pattern along the direction of the longer side of the driving IC chip 50 (the width direction of the terminal portions 14a). This enables efficient, fine pitch arrangement of the terminal portions 14a having a wider width.

In the second preferred embodiment, the insulating member 70 is provided between each terminal portion 14a and a wiring 14 that is adjacent to that terminal portion 14a. The terminal portion 14a is wider than the portion other than the terminal portion 14a of the wiring 14. Therefore, the space between each terminal portion 14a and a wiring 14 adjacent to that terminal portion 14a is relatively narrow. Therefore, for example in the case where the insulating members 70 are not provided, a leakage current is likely to be generated between each terminal portion 14a and a wiring 14 adjacent to that terminal portion 14a. In the second preferred embodiment, however, the insulating member 70 is provided in the relatively narrow space between the wirings. Therefore, generation of leakage current can be effectively suppressed.

First Modification: Modification of the Second Preferred Embodiment

Figure 7:
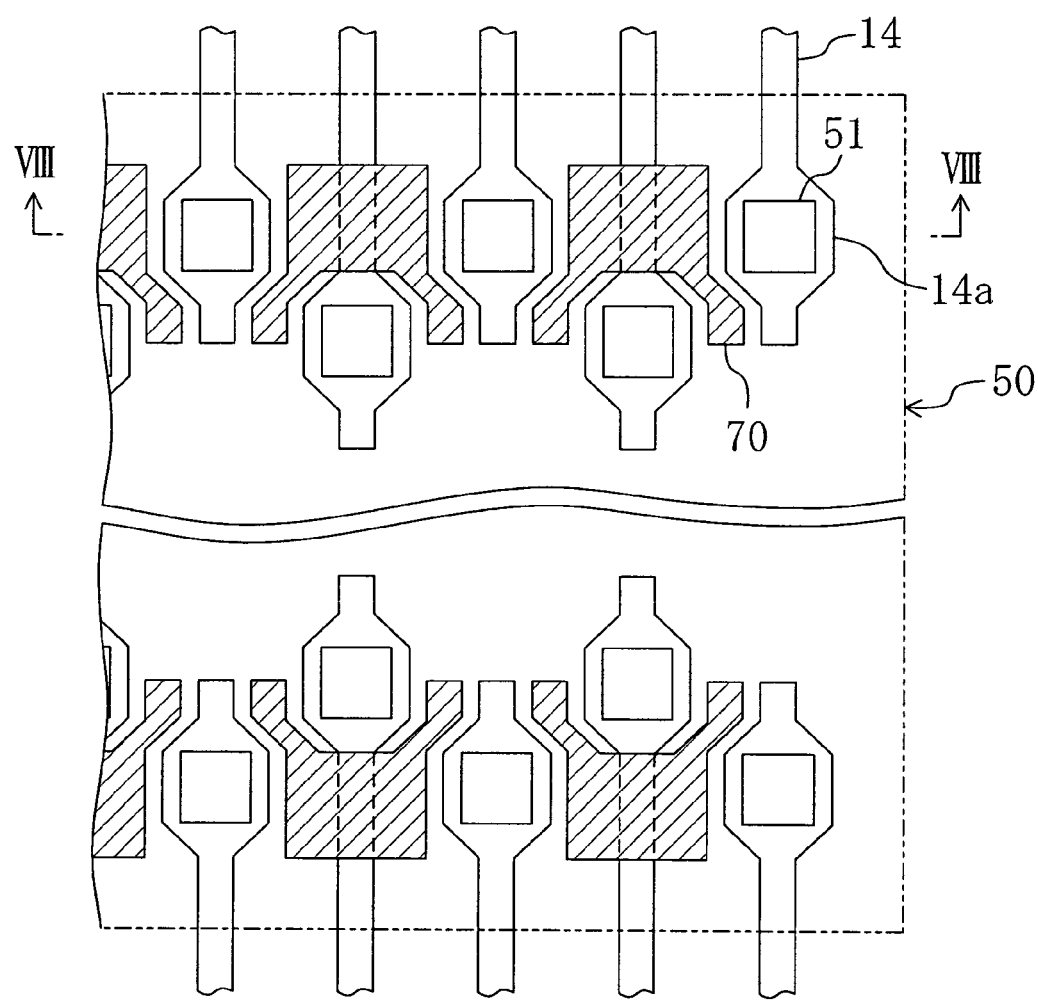
FIG. 7 is an enlarged plan view of a region around a driving IC chip of a liquid crystal display device according to a first modification of preferred embodiments of the present invention.

FIG. 7 is a plan view of a region around a driving IC chip 50 of a liquid crystal display device according to a first modification.

Figure 8:
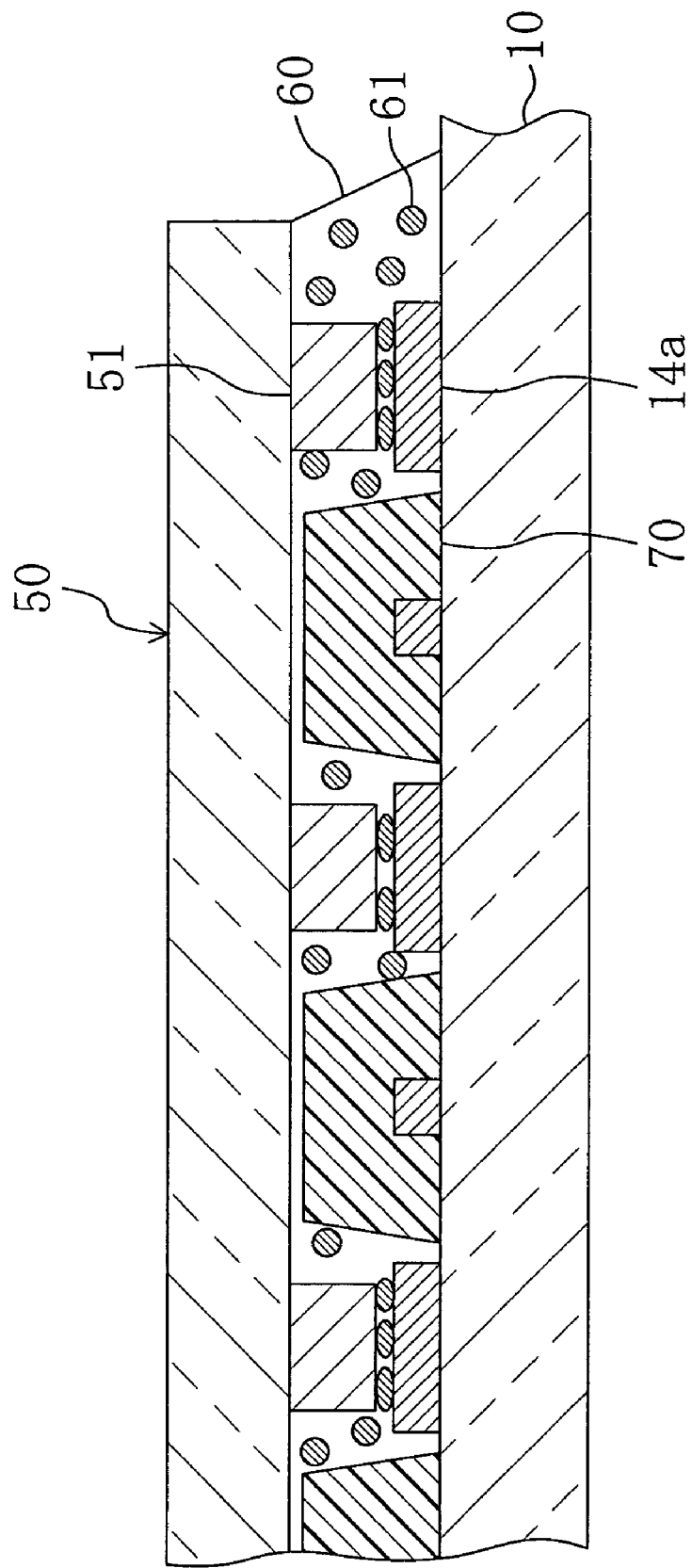
FIG. 8 is a cross-sectional view taken along line VIII-VIII in FIG. 7.

FIG. 8 is a cross-sectional view taken along line VIII-VIII in FIG. 7.

As shown in FIGS. 7 and 8, adjacent insulating members 70 may be connected together so as to extend across the wiring 14. This structure can more effectively suppress generation of leakage current between a terminal portion 14a and a wiring 14 adjacent to the terminal portion 14a.

Third Preferred Embodiment

Figure 9:
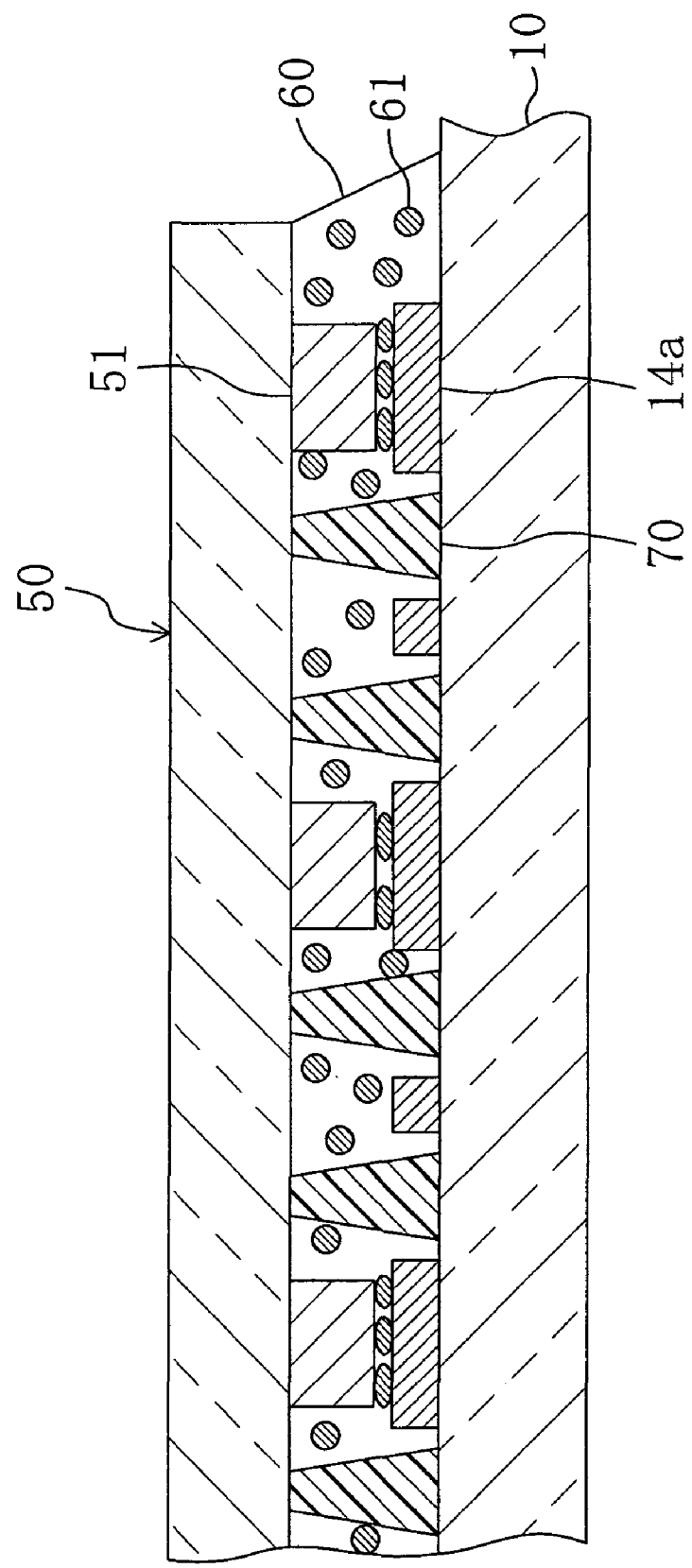
FIG. 9 is an enlarged cross-sectional view of a region around a driving IC chip of a liquid crystal display device according to a third preferred embodiment of the present invention.

FIG. 9 is an enlarged cross-sectional view of a region around a driving IC chip 50 of a liquid crystal display device according to a third preferred embodiment.

The liquid crystal display device of the third preferred embodiment preferably has the same structure as that of the liquid crystal display device of the second preferred embodiment except for the arrangement of the insulating members 70. The arrangement of the insulating members 70 of the third preferred embodiment will be described in detail with reference to FIG. 9. Note that FIGS. 1, 2, and 5 referred to in the second preferred embodiment are also referred to in the third preferred embodiment. Elements having substantially the same function as in the second preferred embodiment will be denoted by the same reference numerals and characters and description thereof will be omitted.

In the third preferred embodiment, the insulating members 70 are arranged in contact with both the active matrix substrate 10 and the driving IC chip 50. This structure especially effectively prevents electrically conductive fine particles 61 from being disposed between the driving IC chip 50 and the insulating members 70, and therefore can effectively suppress generation of leakage current.

Moreover, the driving IC chip 50 can be mounted in a reliable, accurate manner. In other words, problems such as defective connections between a bump electrode 51 and a terminal portion 14a can be effectively suppressed.

As described in the first preferred embodiment, the driving IC chips 50 are mounted by heating and pressing on a pressure bonding stage with a pressure bonding tool.

Figure 10A:
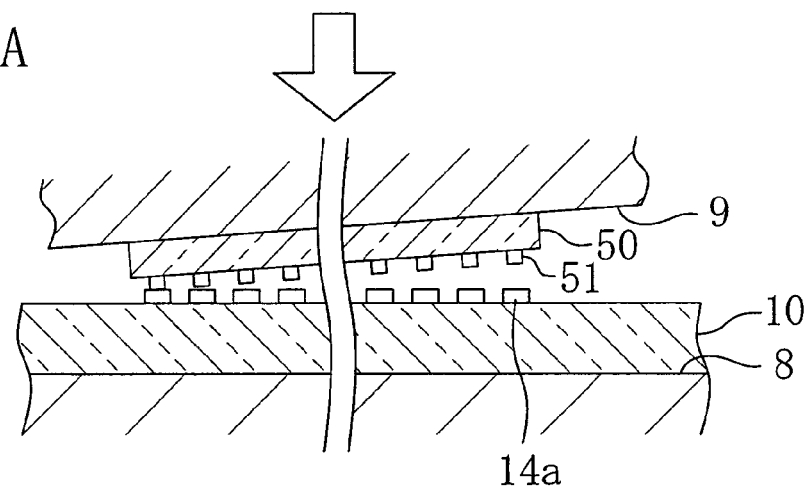
FIGS. 10A and 10B are schematic cross-sectional views illustrating a mounting process in the case where an insulating member is not provided.
Figure 10B:
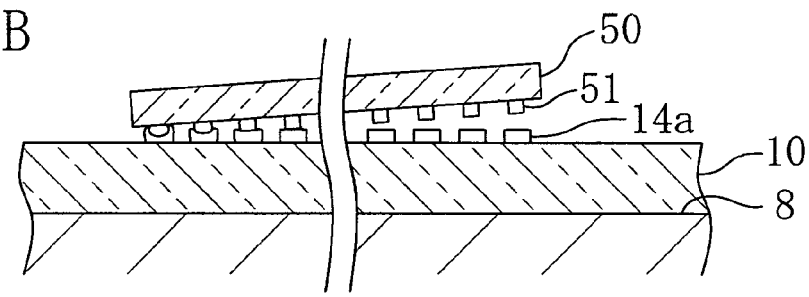

FIGS. 10A and 10B are schematic cross-sectional views illustrating a mounting process, for example, in the case where the insulating members 70 are not provided. More specifically, FIG. 10A is a schematic cross-sectional view of the state before application of pressure. FIG. 10B is a schematic cross-sectional view of the state when mounting is completed.

Essentially, it is preferable that a pressure bonding stage 8 and a pressure bonding tool 9 are completely parallel to each other. However, it is difficult to adjust the pressure bonding stage 8 and the pressure bonding tool 9 completely parallel to each other, and the pressure bonding stage 8 and the pressure bonding tool 9 are usually somewhat tilted with respect to each other as shown in FIG. 10A. In this state, the pressure is not uniformly applied to each terminal portion 14a. An excessive pressure is applied to a region where the active matrix substrate 10 and the driving IC chip 50 are relatively close to each other (a region on the left side of FIGS. 10A and 10B), while the pressure that is applied to a region where the active matrix substrate 10 and the driving IC chip 50 are relatively far from each other (a region on the right side of FIGS. 10A and 10B) is not enough to electrically connect the terminal portions 14a to the respective bump electrodes 51. In other words, in order to obtain electrical conduction between the terminal portions 14a and the bump electrodes 51, the electrically conductive fine particles 61 need to be pressed by the terminal portions 14a and the bump electrodes 51 hard enough to be flatten (deformed) to some extent. However, the pressure that is applied to the region on the right side of FIGS. 10A and 10B is not large enough to deform the electrically conductive fine particles 61.

Therefore, as shown in FIG. 10B, the terminal portions 14a and the bump electrodes 51 may be deformed, disconnected, and the like in the region on the left side of FIGS. 10A and 10B due to the excessive pressure. Moreover, the terminal portions 14a and the bump electrodes 51 may not be electrically connected to each other in a preferable manner in the region on the right side of FIGS. 10A and 10B due to the insufficient pressure. Therefore, mounting may not be implemented in a preferable manner.

On the other hand, the liquid crystal display device of the third preferred embodiment has the insulating members 70 that are in contact with both the active matrix substrate 10 and the driving IC chip 50. Therefore, the driving IC chip 50 can be easily mounted in a preferable manner. The reason for this will now be described in detail.

Figure 11A:
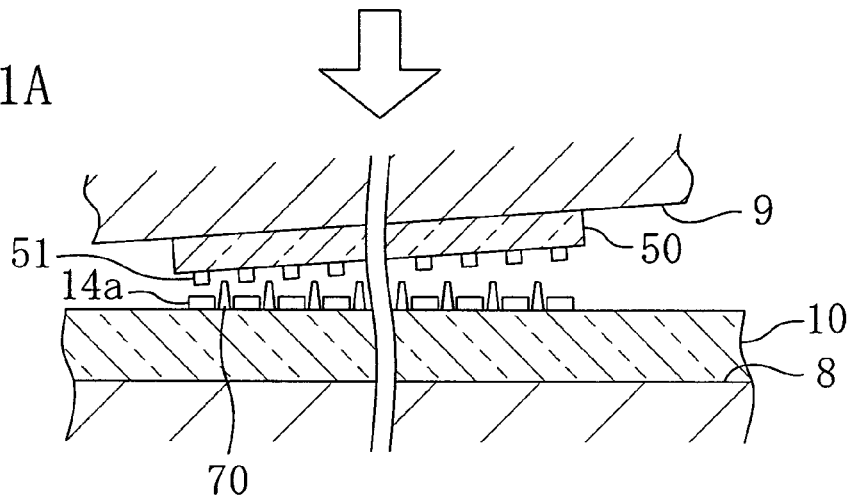
FIGS. 11A, 11B, and 11C are schematic cross-sectional views illustrating a mounting process in the third preferred embodiment of the present invention.
Figure 11B:
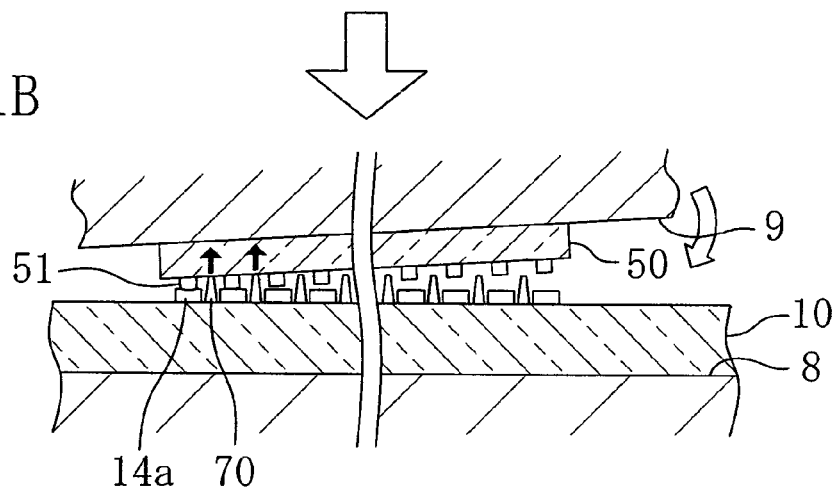
Figure 11C:
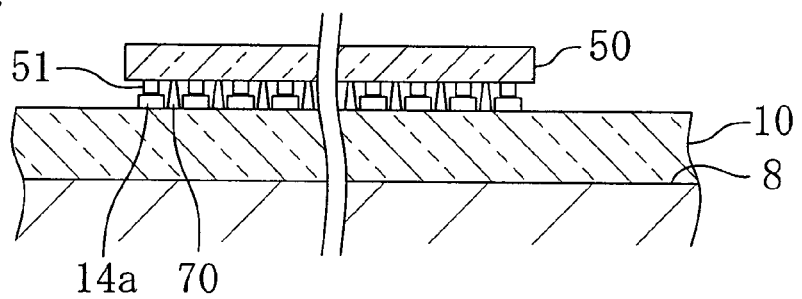

FIGS. 11A, 11B, and 11C are schematic cross-sectional views illustrating a mounting process in the third preferred embodiment. More specifically, FIG. 11A is a schematic cross-sectional view of the state before application of pressure. FIG. 11B is a schematic cross-sectional view of the state during application of pressure. FIG. 11C is a schematic cross-sectional view of the state when mounting is completed.

In the third preferred embodiment, even when the pressure bonding stage 8 and the pressure bonding tool 9 are somewhat tilted with respect to each other, the insulating members 70 that are taller than the terminal portions 14a serve as a support and correct parallelism between the pressure bonding stage 8 and the pressure bonding tool 9 to some extent, as shown in FIG. 11B. Therefore, the problem that an excessive pressure is applied to one or more of the terminal portions 14a is prevented and also the problem that the terminal portions 14a are not electrically connected to the bump electrodes 51 can be effectively prevented. As a result, the driving IC chip 50 can be easily mounted in a preferable manner in the third preferred embodiment.

For example, in the case where the first substrate 11 is a plastic substrate or a thin glass substrate, the first substrate 11 may be warped or deformed in the mounting process. As a result, there may be a place where electrical connection cannot be obtained. In the third preferred embodiment, however, the insulating member 70 serving as a support is provided between the terminal portions 14a. Therefore, warping and deformation of the first substrate 11 can be effectively prevented.

Fourth Preferred Embodiment

Figure 12:
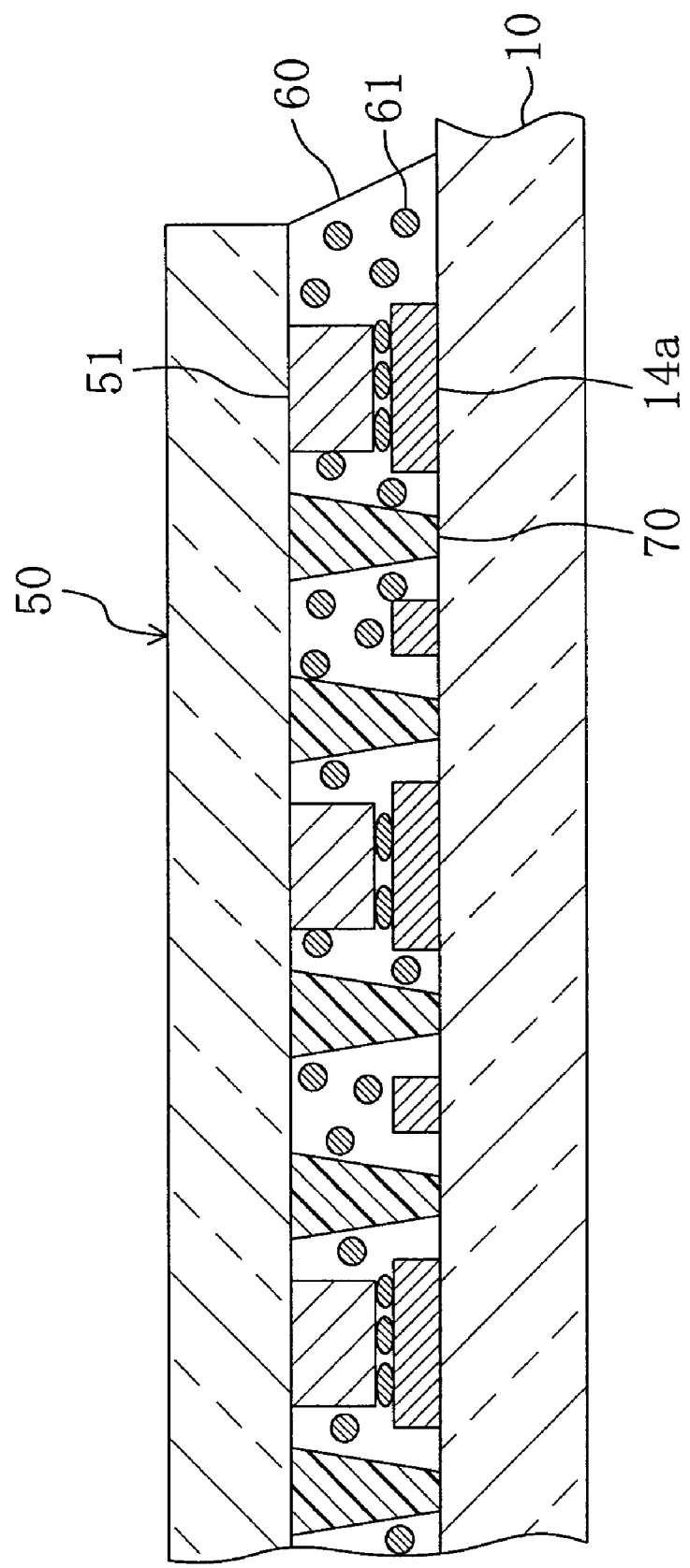
FIG. 12 is an enlarged cross-sectional view of a region around a driving IC chip of a liquid crystal display device according to a fourth preferred embodiment of the present invention.

FIG. 12 is an enlarged cross-sectional view of a region around a driving IC chip 50 of a liquid crystal display device according to a fourth preferred embodiment.

The liquid crystal display device of the fourth preferred embodiment preferably has the same structure as that of the liquid crystal display device of the second preferred embodiment except for the arrangement of the insulating members 70. The arrangement of the insulating members 70 of the fourth preferred embodiment will be described with reference to FIG. 12. Note that FIGS. 1, 2, and 5 referred to in the second preferred embodiment are also referred to in the fourth preferred embodiment. Elements having substantially the same function as in the second preferred embodiment will be denoted by the same reference numerals and characters and description thereof will be omitted.

In the fourth preferred embodiment, the insulating member 70 is provided between adjacent bump electrodes 51 on the driving IC chip 50. The gap between the top of the insulating member 70 and the active matrix substrate 10 is equal to or less than the particle size (mean particle size) of the electrically conductive fine particles 61. This structure can also effectively suppress generation of leakage current between adjacent bump electrodes 51, between adjacent wirings 14, and between a bump electrode 51 and a wiring 14, as in the case where the insulating members 70 are provided on the active matrix substrate 10. As shown in FIG. 12, the insulating member 70 preferably has an approximately trapezoidal shape in cross section with a width reduced from the driving IC chip 50 toward the active matrix substrate 10. More preferably, the width of the top surface of the insulating member 70 is equal to or less than the particle size (mean particle size) of the electrically conductive fine particles 61. This can more effectively suppress generation of leakage current.

Fifth Preferred Embodiment

Figure 13:
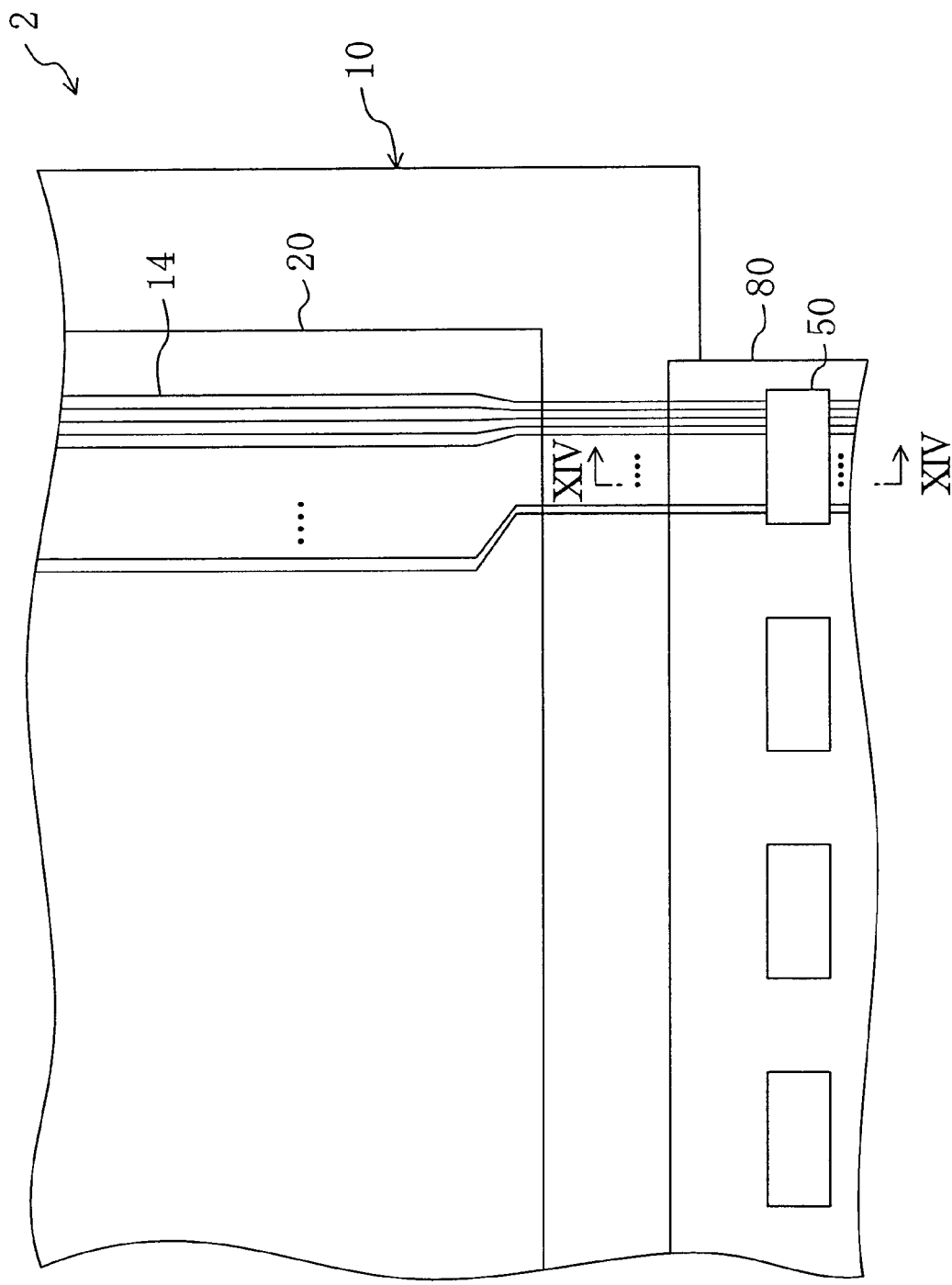
FIG. 13 is a plan view of a liquid crystal display device according to a fifth preferred embodiment of the present invention.

FIG. 13 is a plan view of a liquid crystal display device 2 according to a fifth preferred embodiment.

Figure 14:
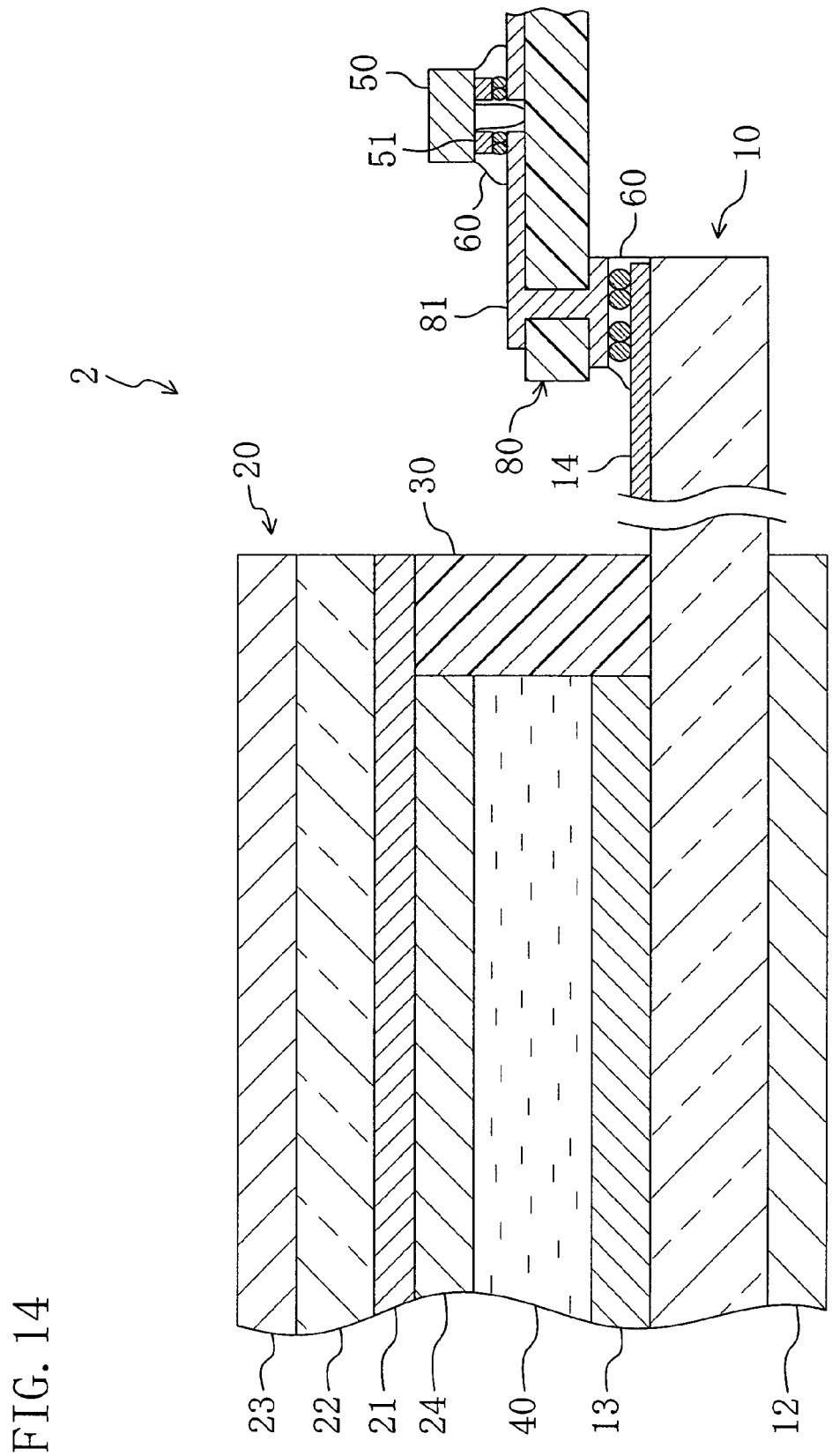
FIG. 14 is a cross-sectional view taken along line XIV-XIV in FIG. 13.

FIG. 14 is a cross-sectional view taken along line XIV-XIV in FIG. 13.

The liquid crystal display device 2 of the fifth preferred embodiment includes an active matrix substrate 10, a counter substrate 20 facing the active matrix substrate 10, a liquid crystal layer 40 provided between the active matrix substrate 10 and the counter substrate 20 as a display medium layer, a seal member 30 bonding the active matrix substrate 10 with the counter substrate 20 and sealing the liquid crystal layer 40, and a flexible printed circuit board 80 (hereinafter, sometimes referred to as an "FPC board 80") mounted on the on the active matrix substrate 10.

The active matrix substrate 10 has a first substrate 11 made of plastic or glass, and a first polarizing plate 12 provided on the opposite side to the liquid crystal layer 40 on the first substrate 11. A plurality of gate lines and a plurality of source lines are provided on the active matrix substrate 10. The plurality of gate lines extend in parallel or substantially in parallel with each other and the plurality of source lines extend in parallel or substantially in parallel with each other at an angle (typically at a right angle) to the extending direction of the gate lines. A switching element (not shown) such as a TFT element is provided near each intersection of the gate lines and the source lines. Each switching element is electrically connected to a corresponding gate line and a corresponding source line. A plurality of pixel electrodes 13 are arranged in a prescribed pattern (typically, in a matrix pattern) on the surface of the active matrix substrate 10 located on the side of the liquid crystal layer 40. Each pixel electrode 13 is electrically connected to a corresponding switching element (not shown) and is driven by that switching element.

The counter substrate 20 has a second substrate 22, a second polarizing plate 23 provided on the opposite side to the liquid crystal layer 40 on the second substrate 22, and an upper common electrode 21 provided on the surface of the second substrate 22 on the side of the liquid crystal layer 40. The liquid crystal display device 2 is driven by voltage application to the liquid crystal layer 40 by the upper common electrode 21 and the plurality of pixel electrodes 13 provided on the active matrix substrate 10.

In the liquid crystal display device 2 of the fifth preferred embodiment, the active matrix substrate 10 is larger than the counter substrate 20, and wirings 14 such as gate lines and source lines are provided in the periphery of the active matrix substrate 10 which is not covered by the counter substrate 20. The FPC board 80 is mounted in this periphery where the wirings 14 are provided. More specifically, as shown in FIG. 14, printed wirings 81 are provided on the FPC board 80. The printed wirings 81 are respectively electrically connected to the wirings 14 through the anisotropic electrically conductive layer 60. Each printed wiring 81 has a terminal portion 81a. The driving IC chip 50 is mounted so that each terminal portion 81a is electrically connected to a corresponding bump electrode 51 of the driving IC chip 50.

Figure 15:
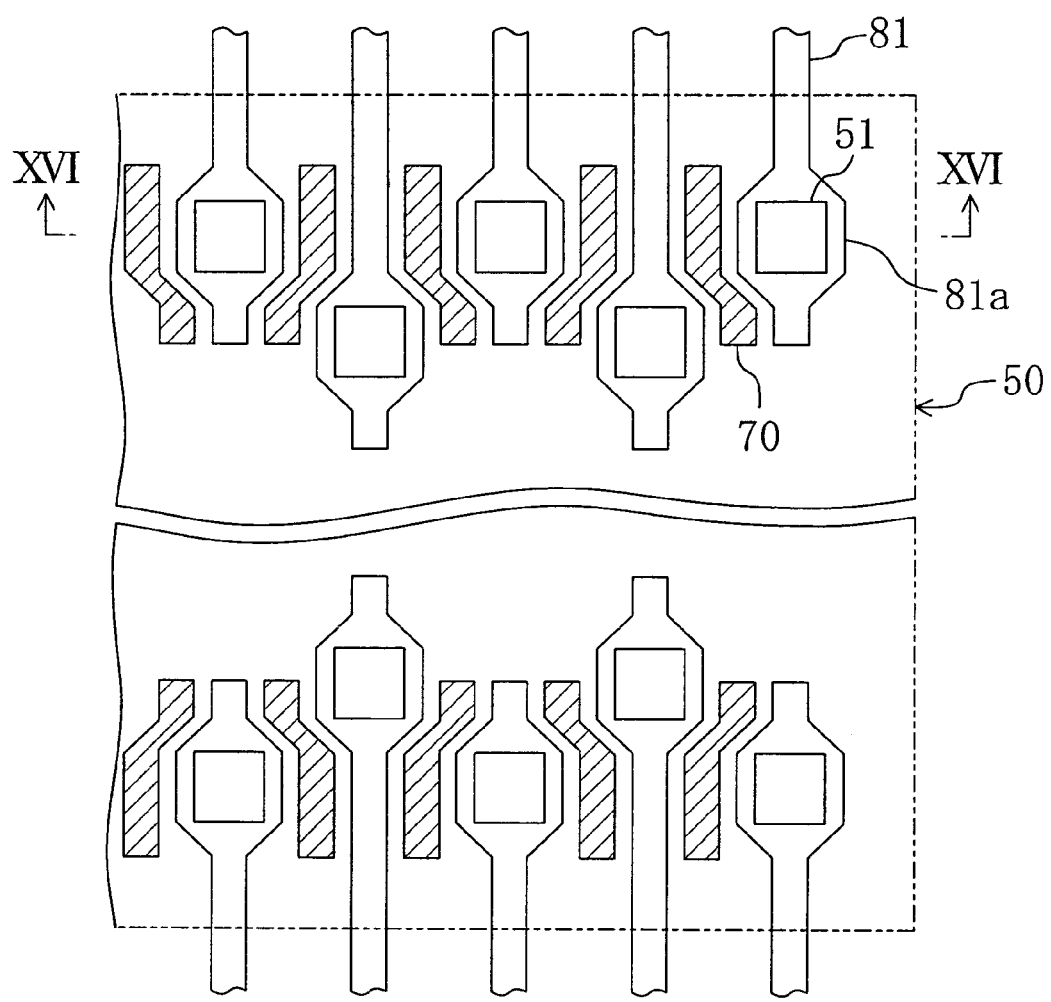
FIG. 15 is an enlarged plan view of a region around a driving IC chip.

FIG. 15 is an enlarged plan view of a region around the driving IC chip 50.

Figure 16:
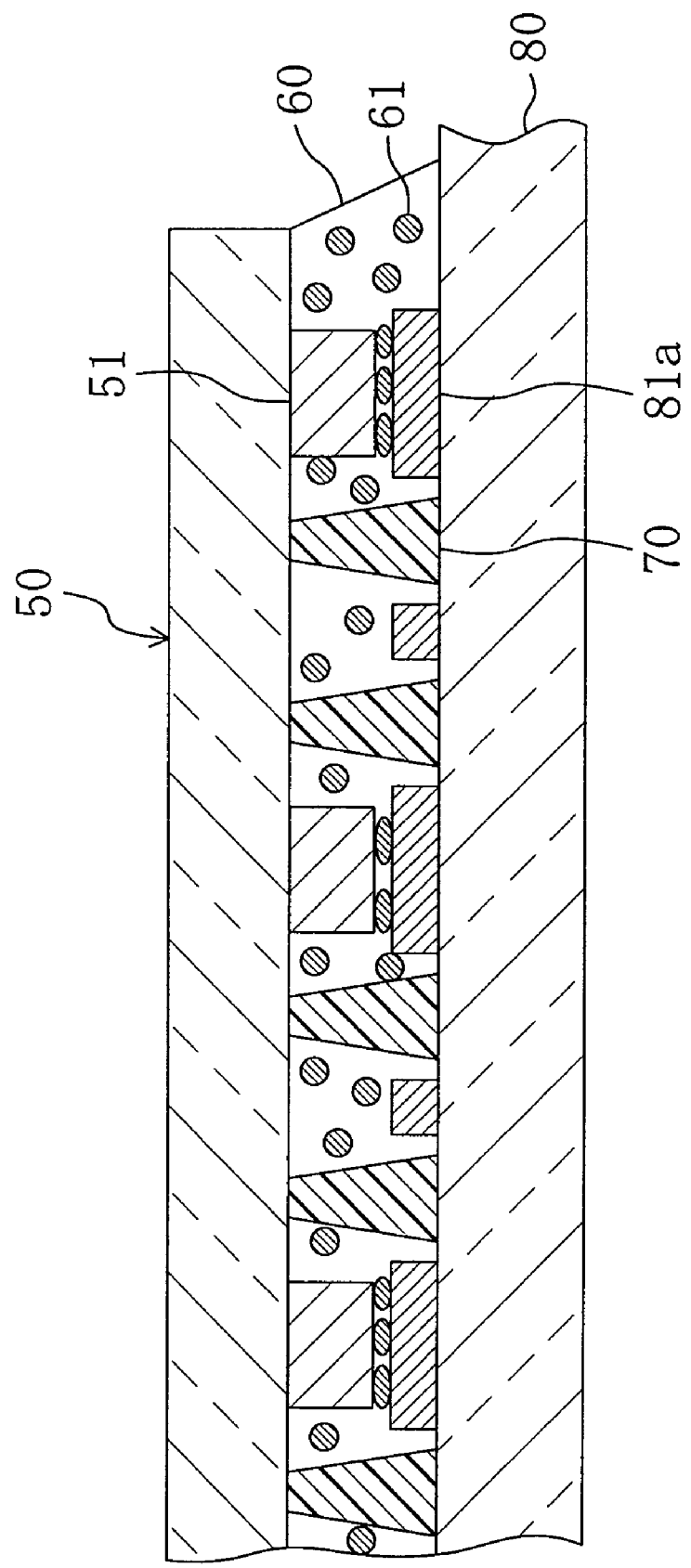
FIG. 16 is a cross-sectional view taken along line XVI-XVI in FIG. 15.

FIG. 16 is a cross-sectional view taken along line XVI-XVI in FIG. 15.

As shown in FIGS. 15 and 16, the driving IC chip 50 has a plurality of bump electrodes 51 as input/output terminals. The bump electrodes 51 are arranged in a staggered pattern along the direction of the longer side of the driving IC chip 50 (the width direction of the terminal portions 81a). The bump electrodes 51 function also as bonding bump electrodes. The bump electrodes 51 are respectively electrically connected through the anisotropic electrically conductive layer 60 to the terminal portions 18a of the printed wirings 81. The anisotropic electrically conductive layer 60 is made of an insulating resin with electrically conductive fine particles 61 dispersed therein.

The liquid crystal display device 2 of the fifth preferred embodiment has an insulating member (an insulating wall) 70. The insulating member 70 isolates each terminal portion 81a from a printed wiring 81 and a bump electrode 51 that are located adjacent to that terminal portion 81a and also isolates a bump electrode 51 facing that terminal portion 81a from a bump electrode 51 and a printed wiring 81 that are located adjacent to that bump electrode 51. More specifically, the insulating member 70 is provided between adjacent terminal portions 81a on the FPC board 80.

For example, in the case where the insulating members 70 are not provided, the electrically conductive fine particles 61 in the anisotropic electrically conductive layer 60 may cause short-circuiting between adjacent printed wirings 81, between adjacent bump electrodes 51, or between a printed wiring 81 and a bump electrode 51, and a leakage current may be generated. Such short-circuiting is likely to occur especially in the case where the anisotropic electrically conductive layer 60 containing a high concentration of the electrically conductive fine particles 61 is used in order to reliably electrically connect the terminal portions 81a with the bump electrodes 51, in the case where a fine-pitch driving IC chip 50 having closely spaced bump electrodes 51 is used, and the like.

However, providing the insulating member 70 between adjacent terminal portions 81a as in the fifth preferred embodiment can effectively suppress generation of leakage current resulting from short-circuiting between adjacent printed wirings 81, between adjacent bump electrodes 51, or between a printed wiring 14 and a bump electrode 51.

As described above, in the fifth preferred embodiment, the terminal portions 81a and the bump electrodes 51 are arranged in a staggered pattern along the direction of the longer side of the rectangular driving IC chip 50 (the width direction of the terminal portions 81a). This enables efficient, fine pitch arrangement of the terminal portions 81a having a wider width.

In the fifth preferred embodiment, the insulating member 70 is provided between each terminal portion 81a and a printed wiring 81 that is adjacent to that terminal portion 81a. The terminal portion 81a is wider than the portion other than the terminal portion 81a of the printed wiring 81. Therefore, the space between each terminal portion 81a and a printed wiring 81 adjacent to that terminal portion 81a is relatively narrow. Therefore, for example in the case where the insulating members 70 are not provided, a leakage current is likely to be generated between each terminal portion 81a and a printed wiring 81 adjacent to that terminal portion 81a. In the fifth preferred embodiment, however, the insulating member 70 is provided in this relatively narrow space between the wirings. Therefore, generation of leakage current can be effectively prevented.

In order to effectively suppress generation of leakage current, the top surface of the insulating member 70 is preferably in contact with the driving IC chip 50, as shown in FIG. 16.

However, the top surface of the insulating member 70 need not necessarily be in contact with the driving IC chip 50. There may be a gap between the driving IC chip 50 and the insulating members 70. Even when there is a gap between the driving IC chip 50 and the insulating members 70, generation of leakage current can be suppressed as compared to the case where the insulating members 70 are not provided. The gap between the driving IC chip 50 and the insulating members 70 is preferably equal to or less than the particle size (more specifically, mean particle size; e.g., about 3 μm to about 5 μm, for example) of the electrically conductive fine particles 61. With this structure, the electrically conductive fine particles 61 can be effectively prevented from being disposed between the driving IC chip 50 and the insulating members 70.

In order to effectively suppress generation of leakage current, the top surface of the insulating member 70 preferably has a narrow width. More preferably, the width of the top surface of the insulating member 70 is equal to or less than the particle size (more specifically, mean particle size) of the electrically conductive fine particles 61.

Sixth Preferred Embodiment

Figure 17:
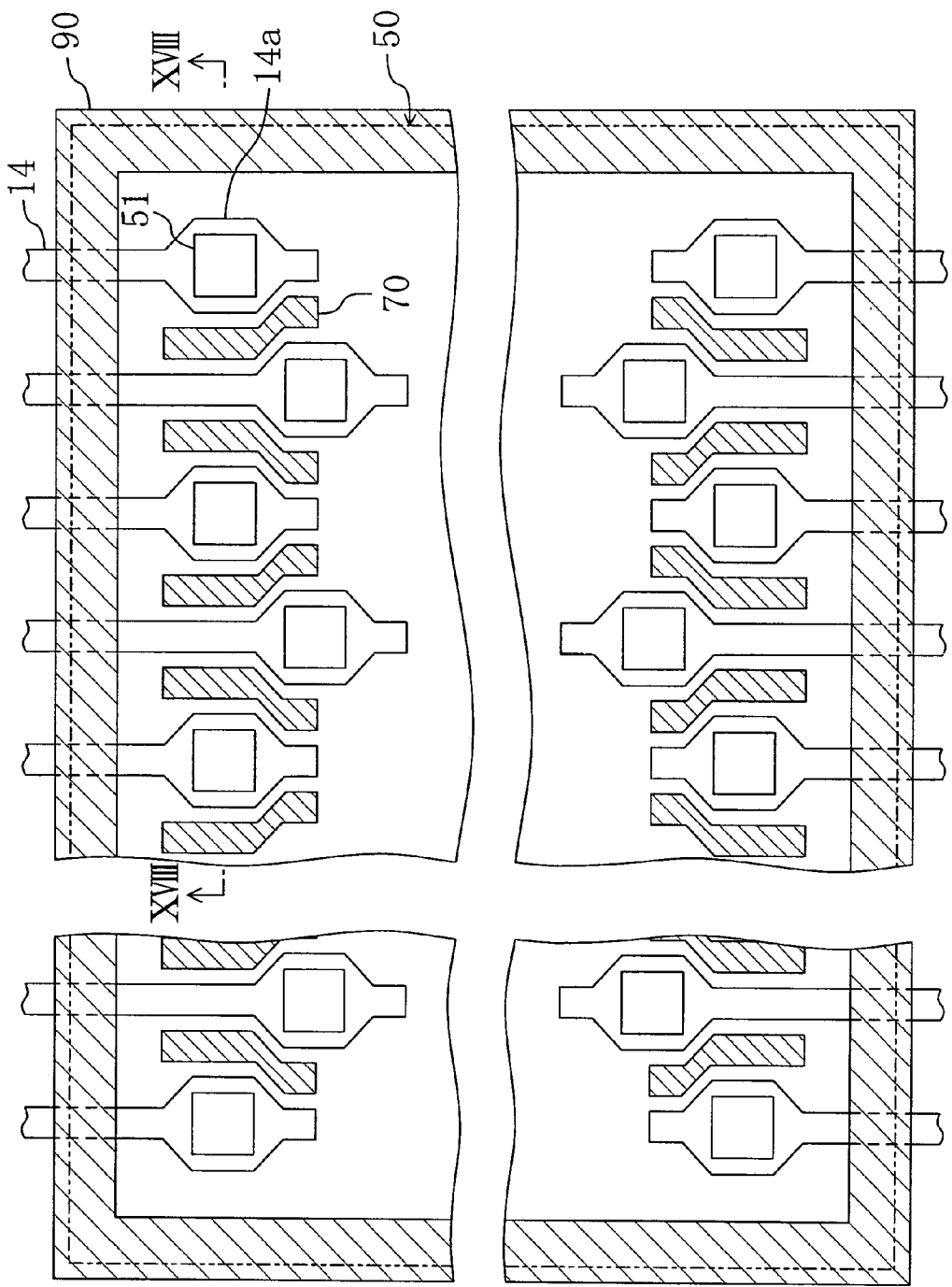
FIG. 17 is an enlarged plan view of a region around a driving IC chip of a liquid crystal display device according to a sixth preferred embodiment of the present invention.

FIG. 17 is an enlarged plan view of a region around a driving IC chip 50 of a liquid crystal display device according to a sixth preferred embodiment.

Figure 18:
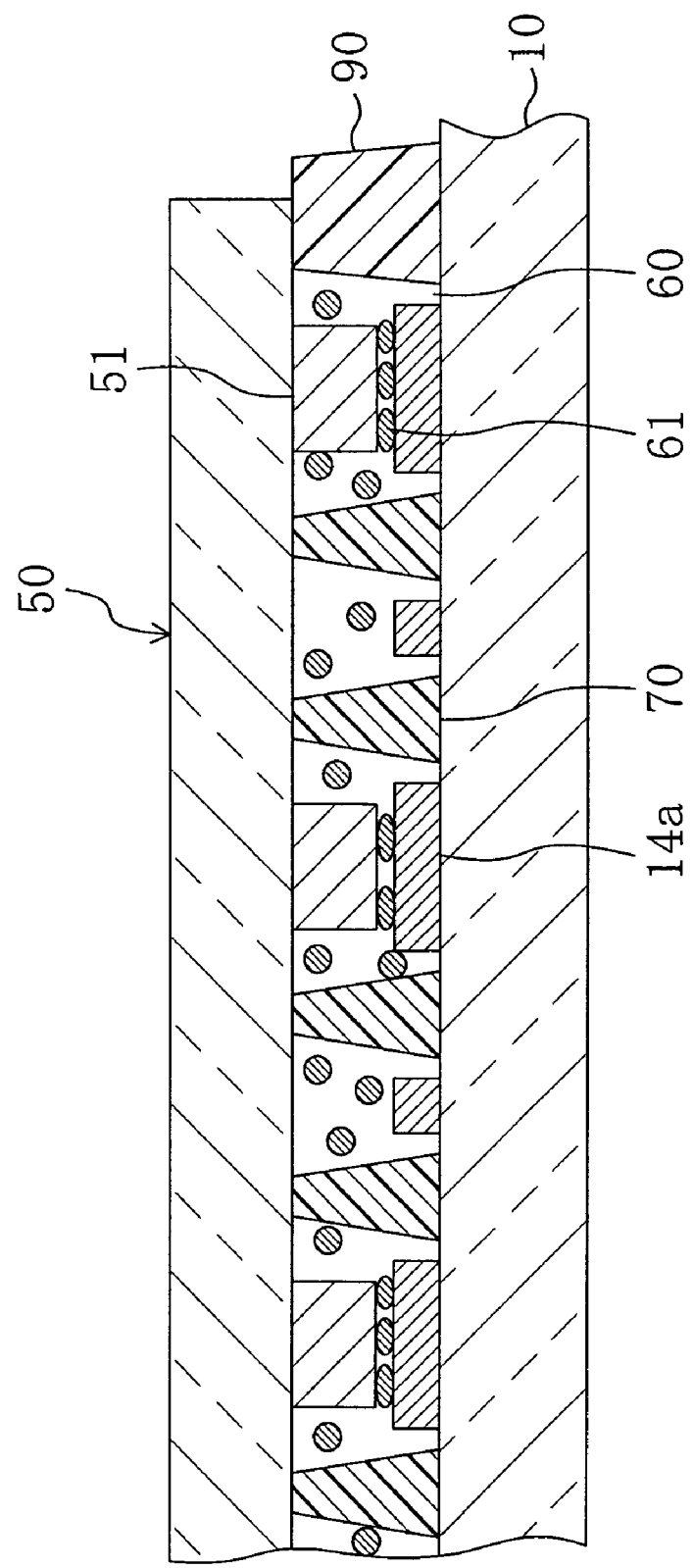
FIG. 18 is a cross-sectional view taken along line XVIII-XVIII in FIG. 17.

FIG. 18 is a cross-sectional view taken along line XVIII-XVIII in FIG. 17.

The liquid crystal display device of the sixth preferred embodiment preferably has the same structure as that of the liquid crystal display device of the third preferred embodiment except that the liquid crystal display device of the sixth preferred embodiment further includes a support member 90. The arrangement of the support member 90 of the sixth preferred embodiment will now be described with reference to FIGS. 17 and 18. Note that FIGS. 1 and 2 referred to in the third preferred embodiment are also referred to in the sixth preferred embodiment. Elements having substantially the same function as in the third preferred embodiment will be denoted by the same reference numerals and characters and description thereof will be omitted.

In the liquid crystal display device of the sixth preferred embodiment, a support member 90 having an approximately trapezoidal shape in cross section is arranged in contact with both the driving IC chip 50 and the active matrix substrate 10. More specifically, the support member 90 is shaped like a wall and extends as a band so as to surround the driving IC chip 50.

As described above, a pressure bonding stage and a pressure bonding tool that are used to mount the driving IC chips 50 are somewhat tilted with respect to each other. In the sixth preferred embodiment, however, the support member 90 arranged so as to surround the driving IC chip 50 corrects the tilt between the pressure bonding stage and the pressure bonding tool to some extent, as in the case of FIGS. 11A, 11B, and 11C. As a result, non-uniformity of pressure application to the terminal portions 14a can be reduced and the terminal portions 14a can be reliably electrically connected to the bump electrodes 51.

In order to more effectively reduce non-uniformity of pressure application to the terminal portions 14a, it is preferable that each insulating members 70 provided between the terminal portions 14a is in contact with both the active matrix substrate 10 and the driving IC chip 50. In this case, it is preferable that the support member 90 and the insulating members 70 have the same height. With this structure, non-uniformity of pressure application resulting from warping and deformation of the active matrix substrate 10 can be eliminated in a preferable manner as described in the third preferred embodiment.

The support member 90 preferably has an insulating property. In the case where the support member 90 is electrically conductive, short-circuiting may occur between the terminal portions 14*a*, between a terminal portion 14*a* and a bump electrode 51, and the like through the electrically conductive fine particles 61 dispersed in the anisotropic electrically conductive layer 60 and the support member 90. As a result, a leakage current may be generated. By using the support member 90 having an insulating property, such short-circuiting caused by the support member 90 can be prevented and generation of leakage current can be effectively prevented.

In the sixth preferred embodiment, the support member 90 is arranged so that the outer edge of the support member 90 protrudes from the periphery of the driving IC chip 50 in view of an alignment margin. With this structure, the support member 90 can be reliably placed on the periphery of the driving IC chip 50 even when the driving IC chip 50 is misaligned with respect to the support member 90.

The support member 90 may be made of the same material as that of the insulating members 70. The support member 90 may be formed simultaneously with the insulating members 70. This can reduce the number of steps in the manufacturing process of the liquid crystal display device, enabling reduction in manufacturing cost.

Second Modification: Modification of the Sixth Preferred Embodiment

Figure 19:
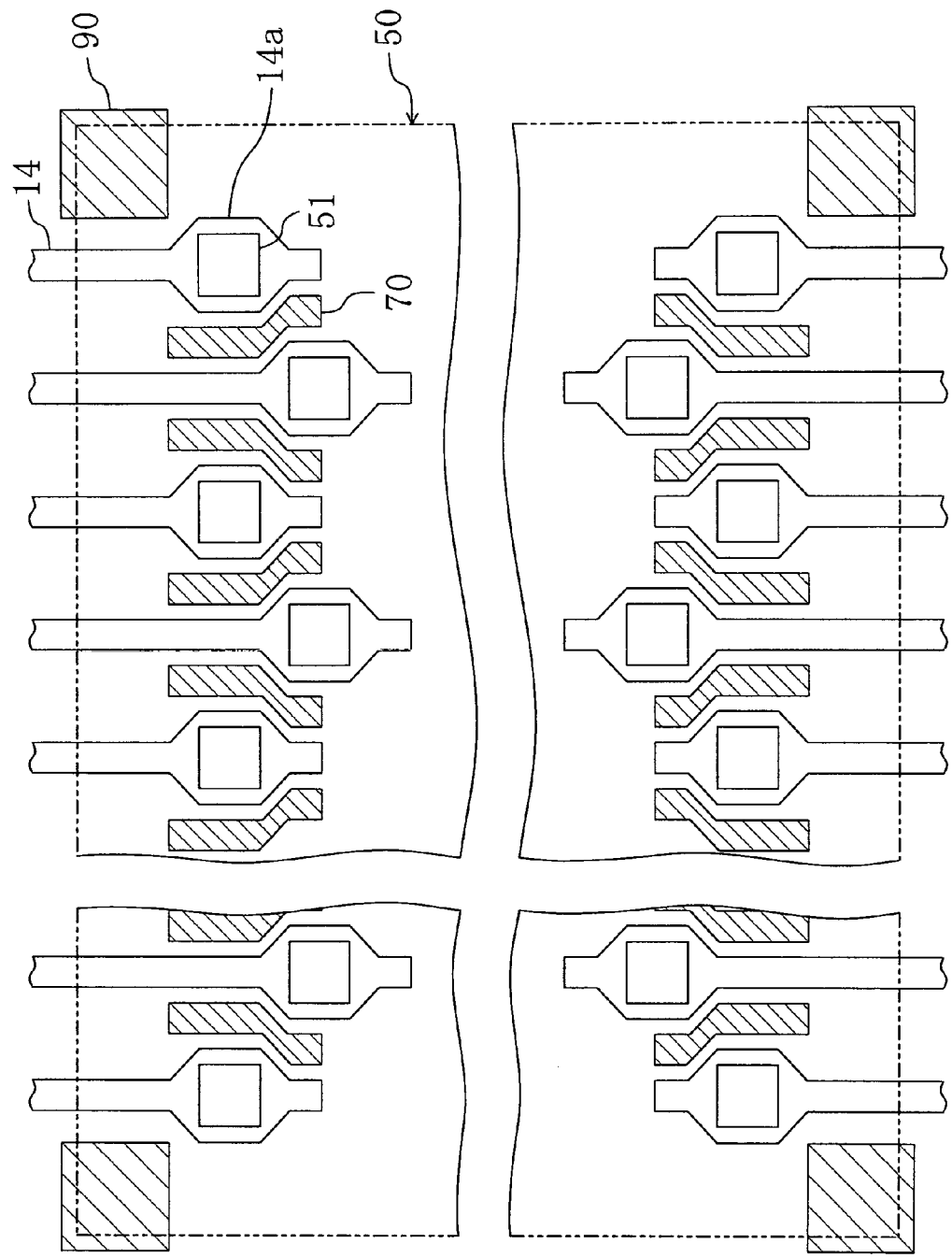
FIG. 19 is an enlarged plan view of a region around a driving IC chip of a liquid crystal display device according to a second modification of preferred embodiments of the present invention.

FIG. 19 is an enlarged plan view of a region around a driving IC chip 50 of a liquid crystal display device according to a second modification.

As shown in FIG. 19, a support member 90 having a substantially rectangular cylindrical shape may be provided between each of the four corners of the driving IC chip 50 and the active matrix substrate 10. With this structure, the support member 90 does not overlap the wirings 14 and unnecessary pressure application to the wirings 14 can be prevented.

Third Modification: Modification of the Sixth Preferred Embodiment

Figure 20:
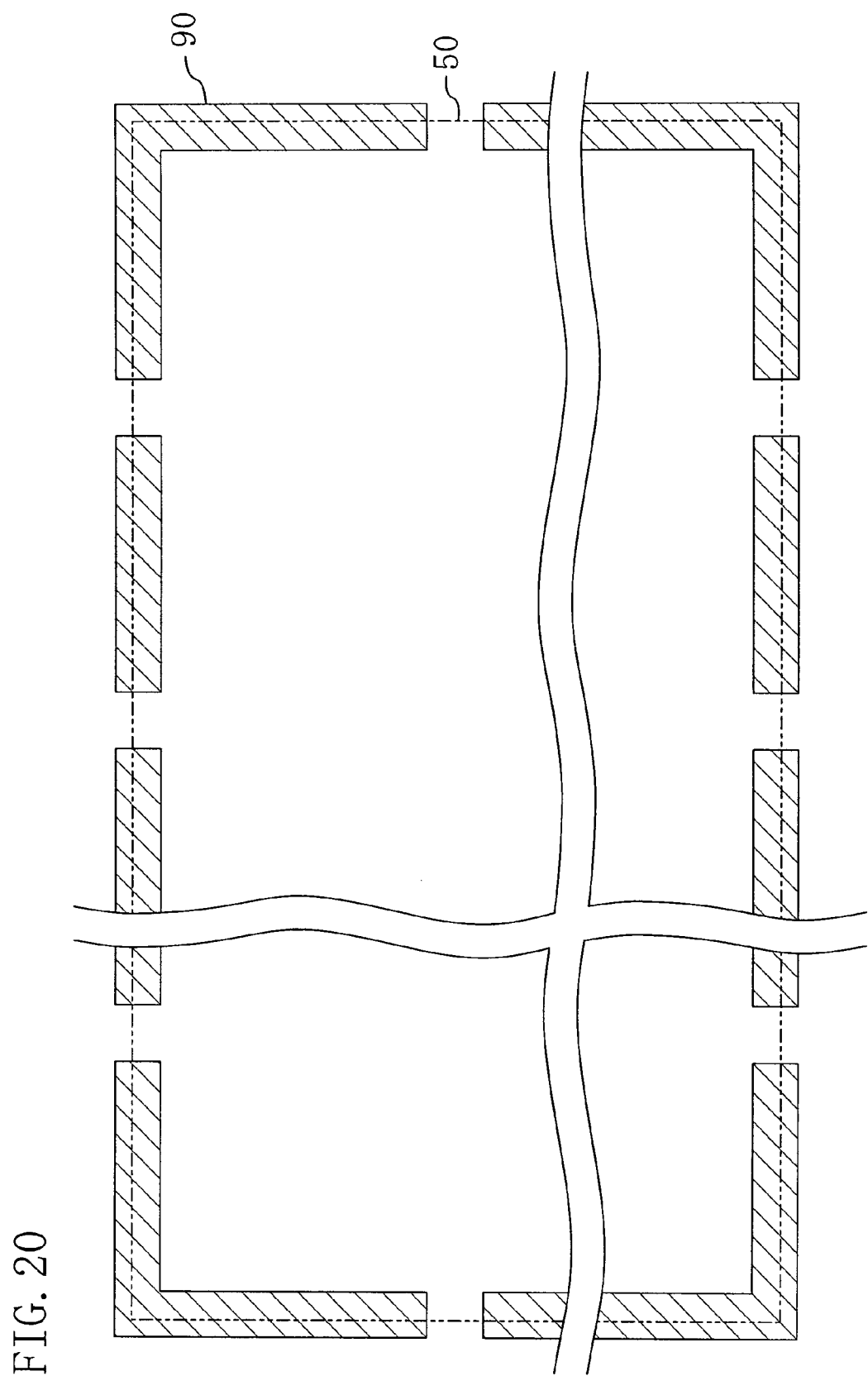
FIG. 20 is an enlarged plan view of a region around a driving IC chip of a liquid crystal display device according to a third modification of preferred embodiments of the present invention.

FIG. 20 is an enlarged schematic plan view of a region around a driving IC chip 50 of a liquid crystal display device according to a third modification. For convenience of explanation, insulating members 70, bump electrodes 51, and wirings 14 are not shown in FIG. 20.

As shown in FIG. 20, the support member 90 may be provided between at least a portion of the periphery of the driving IC chip 50 and the active matrix substrate 10. With this structure, the support member 90 can be prevented from inhibiting the flow of an insulating resin during formation of the anisotropic electrically conductive layer 60.

Fourth Modification: Modification of the Sixth Preferred Embodiment

Figure 21:
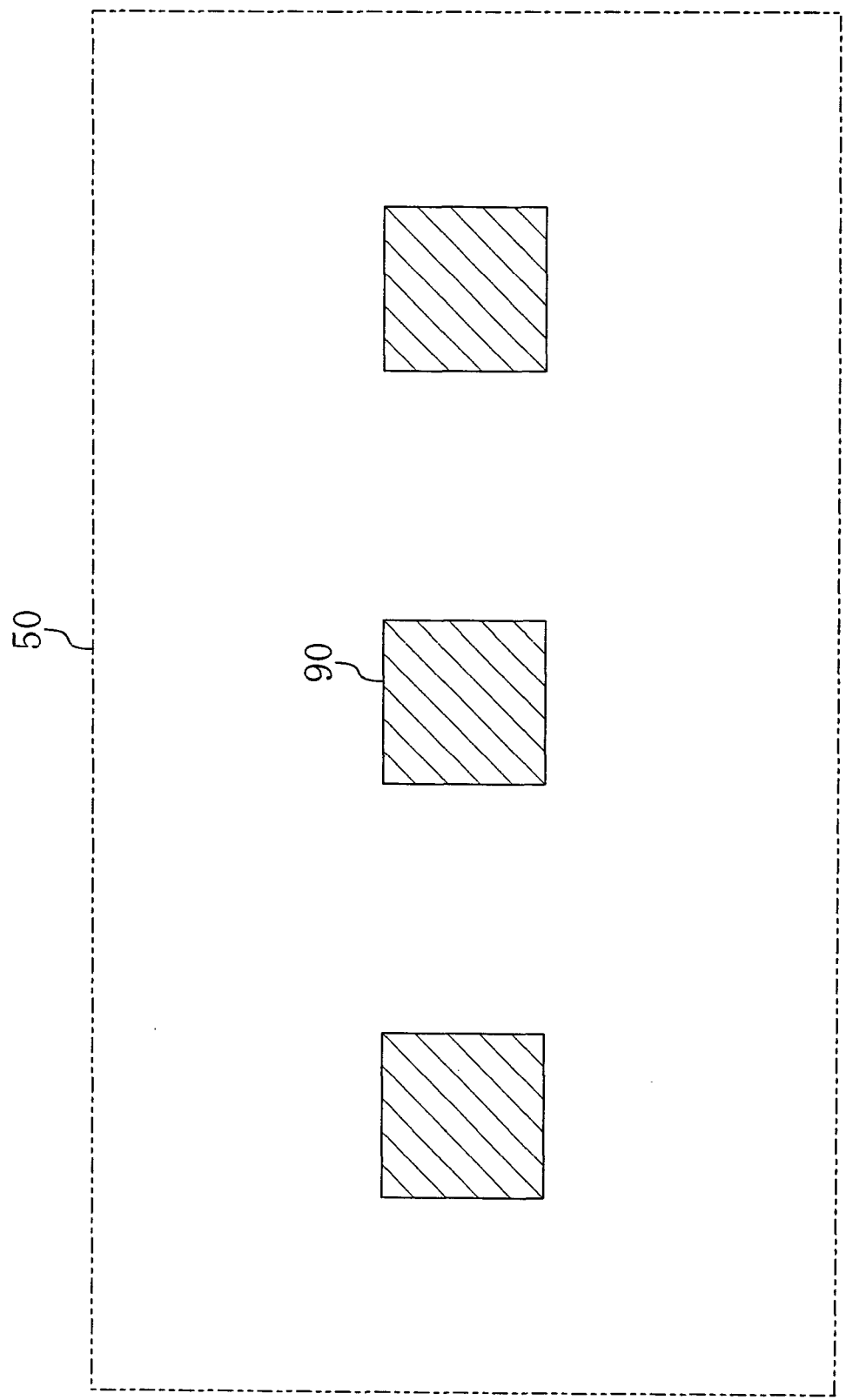
FIG. 21 is an enlarged plan view of a region around a driving IC chip of a liquid crystal display device according to a fourth modification of preferred embodiments of the present invention.

FIG. 21 is an enlarged schematic plan view of a region around a driving IC chip 50 of a liquid crystal display device according to a fourth modification. For convenience of explanation, insulating members 70, bump electrodes 51, and wirings 14 are not shown in FIG. 21.

As shown in FIG. 21, a support member 90 having a substantially rectangular cylindrical shape may be provided in the central region of the driving IC chip 50 which does not have the bump electrodes 51 and is not in contact with the wirings 14. This structure can eliminate non-uniformity of pressure application resulting from warping and deformation of the active matrix substrate 10 in a preferable manner.

In this case, the support member 90 may further be provided between at least a portion of the periphery of the driving IC chip 50 and the active matrix substrate 10 as shown in FIGS. 17, 19, and 20. This structure can eliminate non-uniformity of pressure application resulting from the tilt between the pressure bonding stage and the pressure bonding tool and non-uniformity of pressure application resulting from warping and deformation of the active matrix substrate 10 in a preferable manner.

Fifth Modification: Modification of the First Preferred Embodiment

Figure 22:
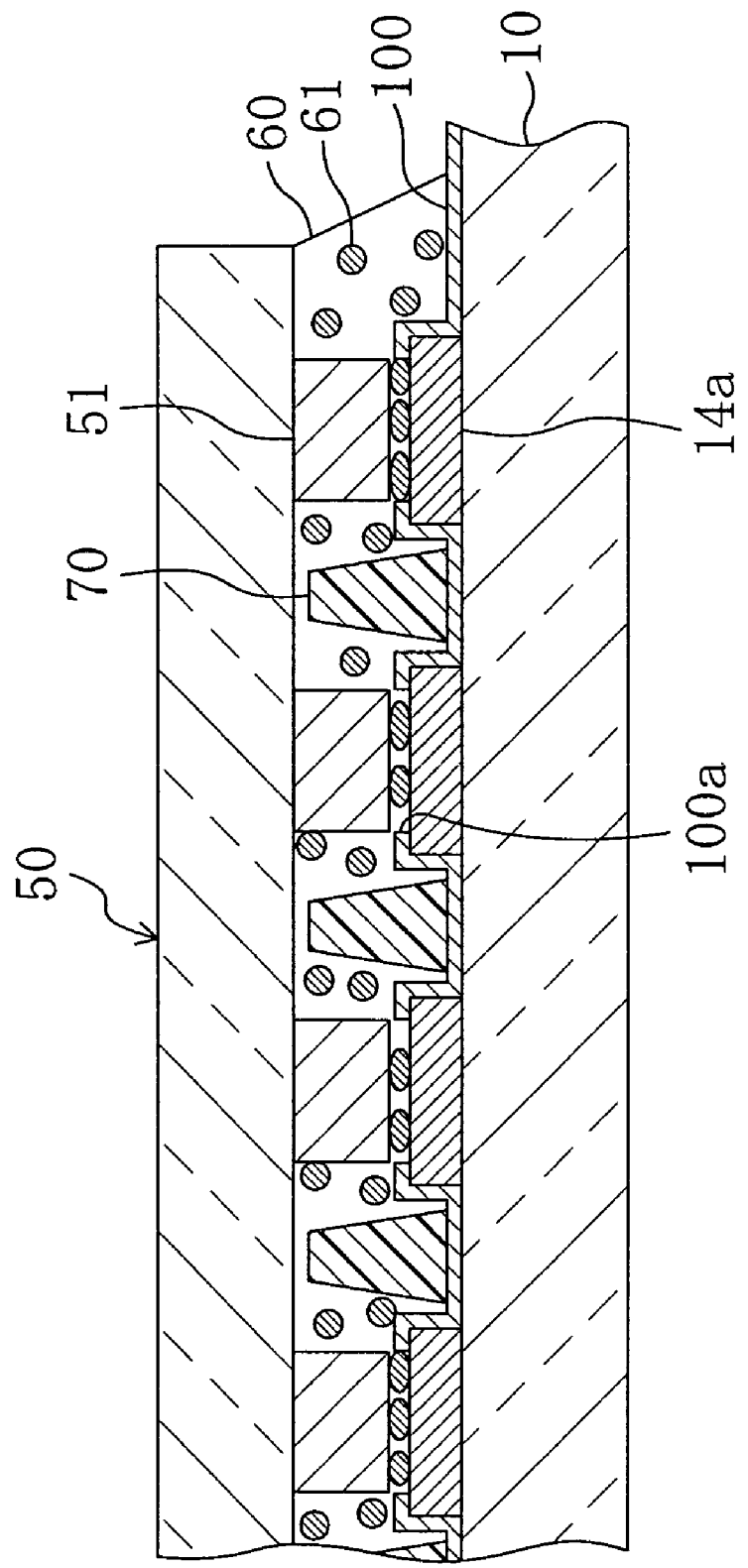
FIG. 22 is an enlarged cross-sectional view of a region around a driving IC chip of a liquid crystal display device according to a fifth modification of preferred embodiments of the present invention.

FIG. 22 is an enlarged cross-sectional view of a region around a driving IC chip 50 of a liquid crystal display device according to a fifth modification.

As shown in FIG. 22, an insulating layer 100 may be formed on the surface of the periphery of the active matrix substrate 10. The insulating layer 100 covers the wirings 14 and has openings 100*a* that expose the terminal portions 14*a*. This structure can very effectively suppress short-circuiting between the wirings 14.

Other Modifications

Although an active matrix type liquid crystal display device has been described in the first through sixth preferred embodiments and their modifications, the present invention is not limited to this. For example, the present invention includes a passive matrix type liquid crystal display device, a segment type liquid crystal display device, each of these types of organic electroluminescence display device, inorganic electroluminescence display device, plasma display device, and field emission display device, and the like.

Although a flexible printed board that is mounted in a display device such as a liquid crystal display device is described in the fifth preferred embodiment, the present invention is not limited to this. For example, the present invention includes a flexible printed board that is mounted on a circuit board of an electronic equipment apparatus such as a communication apparatus, an acoustic apparatus, a computing apparatus, and an information processing apparatus.

As has been described above, a wiring substrate of the present invention can effectively suppress generation of leakage current. Therefore, the present invention is useful for cellular phones, PDAs (Personal Digital Assistances), television sets, electronic books, monitors, electronic posters, clocks, inventory tags, emergency guide signs, and the like.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A wiring substrate, comprising:
   a substrate including a plurality of wirings extending substantially in parallel with each other and each including a terminal portion;
   an integrated circuit chip including a plurality of bump electrodes arranged to correspond to respective terminal portions so as to face the respective terminal portions;
   an anisotropic electrically conductive layer located between the substrate and the integrated circuit chip and made of an insulating resin including electrically conductive fine particles dispersed therein to electrically connect the terminal portions to the plurality of bump electrodes; and
   at least one insulating member arranged to isolate a first one of the plurality of bump electrodes and a facing first terminal portion from a second one of the plurality of bump electrodes and a facing second terminal portion that are adjacent to the first one of the plurality of bump electrodes and the facing first terminal portion; wherein adjacent ones of the terminal portions are offset relative to each other; and a portion of the at least one insulating member is arranged to overlap and cover an upper portion of only alternating ones of the plurality of wirings such that similarly positioned upper portions of directly adjacent ones of the plurality of wirings are not both overlapped and covered by the at least one insulating member.

2. The wiring substrate according to claim 1, wherein the at least one insulating member is located between a terminal portion and a wiring adjacent to the terminal portion on the substrate, and a gap between a top of the at least one insulating member and the integrated circuit chip is equal to or less than a particle size of the electrically conductive fine particles.

3. The wiring substrate according to claim 2, wherein the at least one insulating member includes an approximately trapezoidal shape in cross section with a width reduced from the substrate toward the integrated circuit chip.

4. The wiring substrate according to claim 3, wherein a width of a top surface of the at least one insulating member is equal to or less than the particle size of the electrically conductive fine particles.

5. The wiring substrate according to claim 1, wherein the at least one insulating member is located between adjacent bump electrodes on the integrated circuit chip, and a gap between a top of the at least one insulating member and the substrate is equal to or less than a particle size of the electrically conductive fine particles.

6. The wiring substrate according to claim 5, wherein the at least one insulating member includes an approximately trapezoidal shape in cross section with a width reduced from the integrated circuit chip toward the substrate.

7. The wiring substrate according to claim 1, wherein the substrate is made of plastic.

8. The wiring substrate according to claim 1, wherein the anisotropic electrically conductive layer is made of wet processed material.

9. The wiring substrate according to claim 8, wherein a side surface and a top surface of the at least one insulating member includes a liquid repellent property.

10. The wiring substrate according to claim 1, further comprising a support member located between the integrated circuit chip and the substrate so as to be in contact with both the integrated circuit chip and the substrate.

11. The wiring substrate according to claim 10, wherein the support member includes an insulating property.

12. The wiring substrate according to claim 10, wherein the support member is located between at least a portion of a periphery of the integrated circuit chip and the substrate.

13. The wiring substrate according to claim 10, wherein the support member has a wall-shaped configuration and extends so as to surround the integrated circuit chip.

14. The wiring substrate according to claim 10, wherein the support member is located between each of four corners of the integrated circuit and the substrate.

15. The wiring substrate according to claim 1, wherein each terminal portion of the wirings is wider than other portions of the wirings.

16. The wiring substrate according to claim 15, wherein the at least one insulating member is arranged so as to cover a portion of the wirings positioned between alternating ones of the terminal portions.

17. A display device, comprising:
a wiring substrate including a substrate with a plurality of wirings extending substantially in parallel with each other and each having a terminal portion, an integrated circuit chip including a plurality of bump electrodes arranged to correspond to the respective terminal portions so as to face the respective terminal portions, an anisotropic electrically conductive layer located between the substrate and the integrated circuit chip and made of an insulating resin including electrically conductive fine particles dispersed therein to electrically connect the terminal portions to the plurality of bump electrodes, and at least one insulating member arranged to isolate a first one of the plurality of bump electrodes and a facing first terminal portion from a second one of the plurality of bump electrodes and a facing second terminal portion that are adjacent to the first one of the plurality of bump electrodes and the facing first terminal portion;

a first electrode located on the wiring substrate;
a display medium layer located on the first electrode; and
a second electrode located on the display medium layer; wherein adjacent ones of the terminal portions are offset relative to each other; and a portion of the at least one insulating member is arranged to overlap and cover an upper portion of only alternating ones of the plurality of wirings such that similarly positioned upper portions of directly adjacent ones of the plurality of wirings are not both overlapped and covered by the at least one insulating member.

18. The display device according to claim 17, wherein the display medium layer is a liquid crystal layer.

19. The wiring substrate according to claim 17, wherein each terminal portion of the wirings is wider than other portions of the wirings.

20. The wiring substrate according to claim 19, wherein the at least one insulating member is arranged so as to cover a portion of the wirings positioned between alternating ones of the terminal portions.

21. A display device, comprising:
a first wiring substrate including a substrate with a plurality of first wirings extending substantially in parallel with each other and each including a terminal portion, an integrated circuit chip including a plurality of bump electrodes arranged to correspond to the respective terminal portions so as to face the respective terminal portions, an anisotropic electrically conductive layer located between the substrate and the integrated circuit chip and made of an insulating resin including electrically conductive fine particles dispersed therein to electrically connect the terminal portions to the plurality of bump electrodes, and at least one insulating member arranged to isolate a first one of the plurality of bump electrodes an a facing first terminal portion from a second one of the plurality of bump electrodes and a facing second terminal portion that are adjacent to the first one of the plurality of bump electrodes and the facing first terminal portion;

a second wiring substrate including the first wiring substrate mounted thereon, the second wiring substrate including a plurality of second wirings respectively electrically connected to the plurality of first wirings and a first electrode electrically connected to the plurality of second wirings, respectively;

a display medium layer located on the first electrode; and
a second electrode located on the display medium layer; wherein adjacent ones of the terminal portions are offset relative to each other; and a portion of the at least one insulating member is arranged to overlap and cover an upper portion of only alternating ones of the plurality of first wirings such that similarly positioned upper portions of directly adjacent ones of the plurality of wirings are not both overlapped and covered by the at least one insulating member.

22. The wiring substrate according to claim 21, wherein each terminal portion of the wirings is wider than other portions of the wirings.

23. The wiring substrate according to claim 22, wherein the at least one insulating member is arranged so as to cover a portion of the wirings positioned between alternating ones of the terminal portions.

* * * * *